(12) United States Patent
Esener et al.

(10) Patent No.: US 9,036,253 B2
(45) Date of Patent: May 19, 2015

(54) PHOTONIC DEVICES BASED ON VERTICAL-CAVITY SEMICONDUCTOR OPTICAL AMPLIFIERS

(75) Inventors: Sadik C. Esener, Solana Beach, CA (US); Haijiang Zhang, Milpitas, CA (US); Pengyue Wen, La Jolla, CA (US); Matthias Gross, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 1505 days.

(21) Appl. No.: 12/444,155

(22) PCT Filed: Oct. 5, 2007

(86) PCT No.: PCT/US2007/080639
§ 371 (c)(1),
(2), (4) Date: Apr. 23, 2009

(87) PCT Pub. No.: WO2008/045810
PCT Pub. Date: Apr. 17, 2008

(65) Prior Publication Data
US 2010/0027104 A1 Feb. 4, 2010

Related U.S. Application Data

(60) Provisional application No. 60/828,577, filed on Oct. 6, 2006.

(51) Int. Cl.
| | | |
|---|---|---|
| H01S 5/00 | (2006.01) |
| G02F 3/02 | (2006.01) |
| H04B 10/291 | (2013.01) |
| H01S 5/04 | (2006.01) |
| H01S 5/06 | (2006.01) |
| H01S 5/183 | (2006.01) |
| H01S 5/42 | (2006.01) |
| H01S 5/50 | (2006.01) |

(52) U.S. Cl.
CPC . *G02F 3/02* (2013.01); *H01S 5/041* (2013.01); *H01S 5/0607* (2013.01); *H01S 5/18308* (2013.01); *H01S 5/423* (2013.01); *H01S 5/50* (2013.01); *H04B 10/2914* (2013.01)

(58) Field of Classification Search
USPC .................................................. 359/108, 344
See application file for complete search history.

(56) References Cited

U.S. PATENT DOCUMENTS 4,573,767 A * 3/1986 Jewell ........................... 359/243
5,073,041 A   12/1991 Rastani
(Continued)

FOREIGN PATENT DOCUMENTS

WO    WO 2008/045810    4/2008

OTHER PUBLICATIONS

Wen et al., "Vertical-cavity optical and gate", Optics Communications, vol. 219, pp. 383-387, (published Feb. 2003).*
(Continued)

*Primary Examiner* — Eric Bolda
(74) *Attorney, Agent, or Firm* — Perkins Coie LLP

(57) ABSTRACT

Vertical cavity semiconductor optical amplifiers for various photonic devices including all optical logic gate devices and oscillators, where such devices can be implemented to achieve various advantages, including Boolean inversion at high speeds, low power, workable noise margins for cascadability because of input output isolation, and easy of integration in large arrays.

15 Claims, 22 Drawing Sheets

(56) References Cited

U.S. PATENT DOCUMENTS

| | | | |
|---|---|---|---|
| 5,283,447 A | 2/1994 | Olbright et al. | |
| 5,757,525 A | 5/1998 | Rao et al. | |
| 6,456,417 B1* | 9/2002 | Maywar et al. | 359/245 |
| 6,462,865 B1* | 10/2002 | Chu et al. | 359/344 |
| 6,853,658 B1 | 2/2005 | DiJaili et al. | |
| 7,113,329 B2* | 9/2006 | DiJaili et al. | 359/344 |
| 7,248,400 B2* | 7/2007 | Byun et al. | 359/344 |
| 2006/0092501 A1* | 5/2006 | Byun et al. | 359/333 |
| 2009/0067300 A1* | 3/2009 | Maywar et al. | 369/47.1 |

OTHER PUBLICATIONS

International Search Report and Written Opinion dated Feb. 11, 2008, for PCT/US2007/080639, published as WO 2008/045810, and entitled "Photonic Devices Based on Vertical-Cavity Semiconductor Optical Amplifiers," (10 pages).

Adams, M.J., "Physics and applications of optical bistability in semiconductor laser amplifiers," Solid-State Electronics, vol. 30, No. 1, pp. 43-51 (1987).

Bobrov, Y. et al., "Thin film polarizers for liquid crystal displays," Proceedings of SPIE, vol. 4511, pp. 133-140 (2001).

Bogris, A., "Numerical Investigation of a 160-Gb/s Reconfigurable Photonic Logic Gate Based on Cross-Phase Modulation in Fibers," IEEE Photonics Technology Letters, vol. 19, No. 6, pp. 402-404 (2007).

Esener, S. and P. Wen, "Photonics in Computing: Interconnects and Beyond," in Frontiers in Optics, OSA Technical Digest, Optical Society of America, Rochester, NY, Oct. 2006, Abstract, 1 page.

Kimura, T. et al., "High-Temperature Characteristics and Tunability of Long-Wavelength Vertical-Cavity Semiconductor Optical Amplifiers," IEEE Photonics Technology Letters 15(11): 1501-1503 (Nov. 2003).

Kimura, T et al., "Optically Preamplified Receiver at 10, 20 and 40 Gb/s Using a 1550-nm Vertical Cavity SOA," IEEE Photonics Technology Letters, vol. 17, No. 2, pp. 456-458 (2005).

Koga, M. et al., "Gain controlled all-optical inverter switch in a semiconductor laser amplifier," Applied Optics, vol. 27, No. 19, pp. 3964-3965, (Oct. 1, 1988).

Kumar, S. and A.E. Willner, "Simulatenous four-wave mixing and cross-gain modulation for implementing an all-optical XNOR logic gate using a single SOA," Optics Express 14(12): 5092-5097 (Jun. 12, 2006).

Kumar, S. and A.E. Willner, "All-optical half adder using an SOA and a PPLN waveguide for signal processing in optical networks," Optics Express, vol. 14, No. 22, pp. 10255-10260 (2006).

Marino, F. et al., "Cross-gain modulation in broad-area vertical cavity semiconductor optical amplifer," Applied Physics Letters 86: 151116-1-151116-3 (2005).

Marki, C.F. et al., "Cascadable optical inversion using 1550 VCSEL," Electronics Letters, vol. 44, No. 4, pp. 292-293 (Feb. 2008).

Marki, C.F. et al, "Observation of counterclockwise, clockwise and butterfly bistabilty in 1550 nm VCSOAs" Optics Express, vol. 15, No. 8, pp. 4953-4959 (Apr. 2007).

McAulay, A.D., "Novel all-optical flip-flop using semiconductor optical amplifiers in innovative frequency-shifting inverse-threshold pairs," Opt. Eng. 43(5): 1115-1120 (May 2004).

Morita, Y. et al., "Active Liquid Crystal Devices Incorporating Liquid Crystal Polymer Thin Film Waveplates," Jpn. J. Appl. Phys., vol. 38, pp. 95-100 (1999).

Sánchez, M. et al., "All-Optical 2R Regeneration Using a Non-Linear Vertical Cavity Semiconductor Optical Amplifier," Trends in Optics and Photonics Series, vol. 90, pp. 78-81 (2003).

Sánchez, M. et al., "Rate Equations for modeling dispersive nonlinearity in Fabry-Perot semiconductor optical amplifiers," Optics Express 11(21): 2689-2696 (Oct. 20, 2003).

Sánchez, P., "Polarization anisotropy in vertical-cavity semiconductor optical amplifiers," Optics Letters, vol. 29, No. 16, pp. 1888-1890 (2004).

Son, C.W., "Realization of All-Optical XOR, NOR, and NAND Gates in Single Format by Using Semiconductor Optical Amplifiers," Japanese Journal of Applied Physics, vol. 46, No. 1, pp. 232-234 (2007).

Song et al., "All-optical flip-flop based on vertical cavity semiconductor optical amplifiers," Optics Letters, vol. 32, No. 20, pp. 2969-2971 (2007).

Wang, J. et al., "Proposal for All-Optical Switchable OR/XOR Logic Gates Using Sum-Frequency Generation," IEEE Photonics Techology Letters, vol. 19, No. 8 , pp. 541-543 (2007).

Wen, P et al., "Observation of bistability in a Vertical-Cavity Semiconductor Optical Amplifier (VCSOA)," Optics Express vol. 10, No. 22, pp. 1273-1278 (2002).

Wen, P. et al., "Optical bistability in a Vertical-Cavity Semiconductor Optical Amplifier (VCSOA): pulsed input," Trends in Optica and Photonics Series vol. 90, pp. 75-77 (2003).

Wen, P., "Optical Bistability in Vertical-Cavity Semiconductor Optical Amplifiers," Applied Optics, vol. 45, No. 25, pp. 6349-6357 (2006).

Zhang, H., "Observation of wavelength and multiple bistabilities in 850nm Vertical-Cavity Semiconductor Optical Amplifiers (VCSOAs)," Optics Express, vol. 15, Issue 18, pp. 11723-11730 (Sep. 2007).

Zhang, H. et al., "Cascadable all-optical inverter based on a nonlinear vertical cavity semiconductor optical amplifier," Optics Letters, vol. 32, No. 13, pp. 1884-1886 (2007).

Zhang, M. et al., "All-Optical XOR Logic Gates: Technologies and Experiment Demonstrations," IEEE Communications Magazine, vol. 43, No. 5, pp. S19-S24 May 2005.

* cited by examiner

Reflective VCSOA Inverter

Transmissive VCSOA Inverter

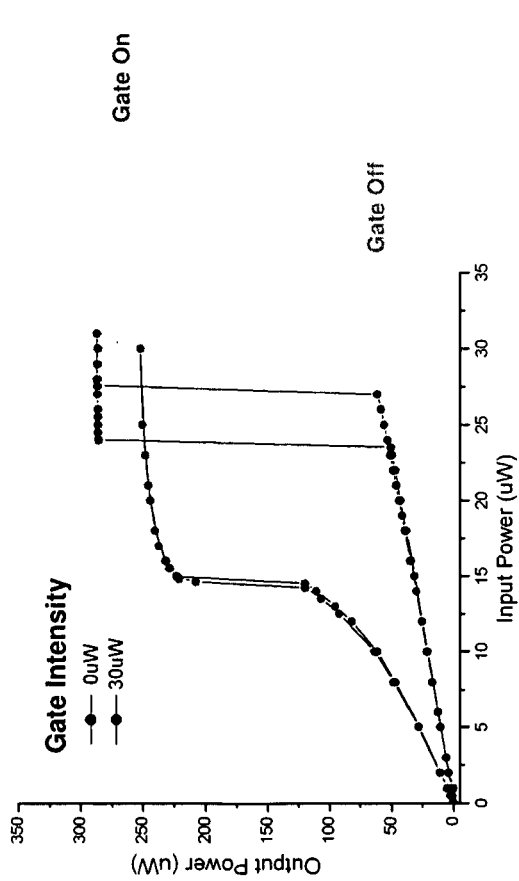
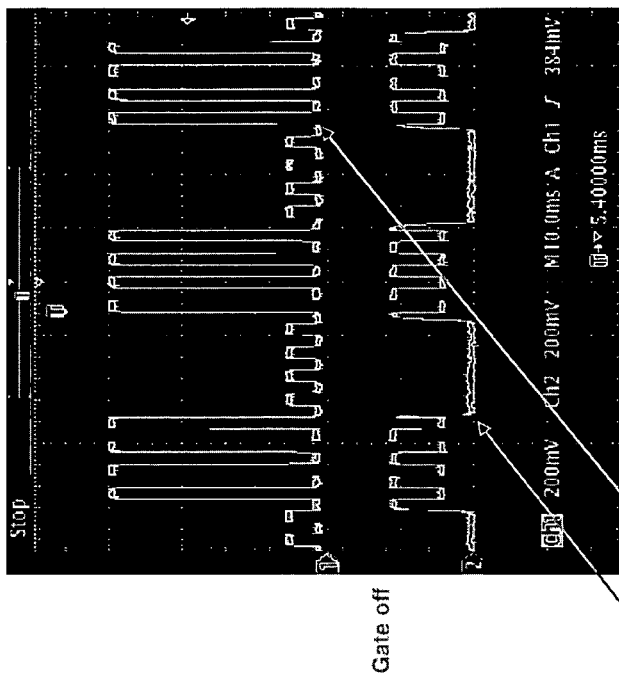
FIG. 5C Optical AND Gate: Output
FIG. 5A Optical Transmission Gate
FIG. 5B Optical AND Gate: Device Design
On-OFF Ratio: 5:1
Signal restoration possible if followed by an inverter
Pass Transistor is ON when Gate is OFF

*Optical NOR Gate No. 1*
(based on the inverted output of an OR gate)

*Optical NOR Gate No. 2*
(using an inverter followed by an optical switch)

Optical NOR Gate Example based on design in FIG. 6B

Optical NAND Gate No. 1

Optical NAND Gate No. 2

Optical NAND Gate Example based on design in FIG. 7A

*Optical XOR Gate*

*Optical Ring Oscillator based on VCSOA Inverters*

*Single Stage Optical Oscillator based on VCSOA Inverter*

Design: Optical Flip-flop based on VCSOA Inverters

Example: Optical Flip-flop based on VCSOA Inverters

*Data Obtained in FIG. 11B*

*Example: Integrated Flip-Flop based on Transmissive VCSOA Inverters*

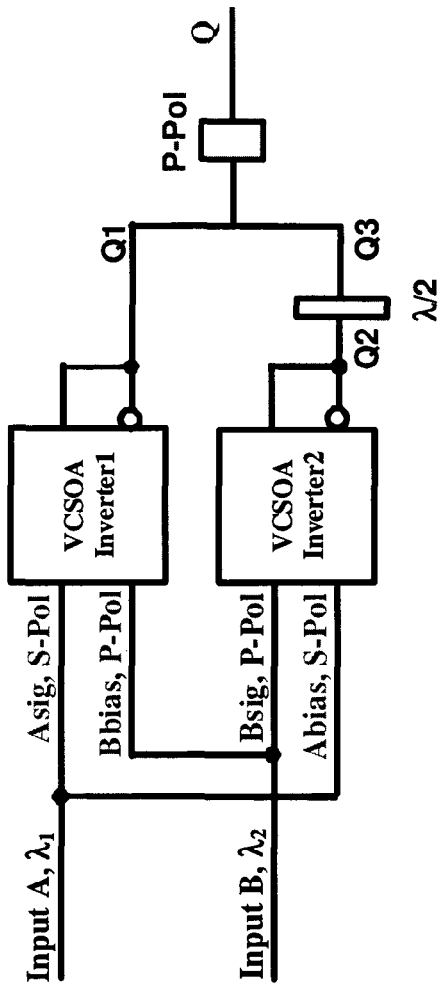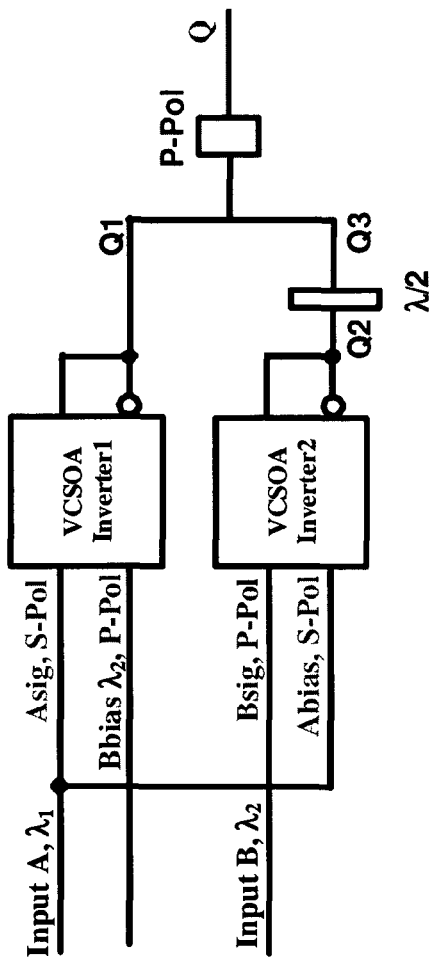
FIG. 16A VCSOA XOR
FIG. 16B VCSOA NAND

PHOTONIC DEVICES BASED ON VERTICAL-CAVITY SEMICONDUCTOR OPTICAL AMPLIFIERS

CROSS-REFERENCE TO RELATED APPLICATIONS

This application is a national stage application of and claims the benefit of PCT Application No. PCT/US2007/080639, filed on Oct. 5, 2007, and published as WO 2008/045810, which claims priority to U.S. Provisional Application No. 60/828,577 entitled "Photonic Devices Based On Vertical-Cavity Semiconductor Optical Amplifiers: Microphotonic Inverters, Flip-Flops And Logic Circuits And Their Integration" and filed on Oct. 6, 2006. The disclosure of the two prior applications are considered part of (and is incorporated by reference in) the disclosure of this application.

FEDERALLY SPONSORED RESEARCH OR DEVELOPMENT This invention was made with government support under W911NF-05-1-0243 awarded by the Army Research Office. The government has certain rights in the invention.

BACKGROUND

This application relates to devices and techniques for optical signal processing.

Data communications and signal processing in the optical domain can be implemented to achieve various technical advantages, e.g., high-speed communication and processing with reduced electromagnetic interference, and parallel processing. All optical inverters and all optical flip-flop devices are building blocks for all optical processing devices and circuits and have attracted extensive research attentions since 1980's. For example, all optical inverters and all optical flip-flop devices can be used in a wide range of applications, including, among others, all-optical memory, optical 3R regeneration for signal reamplification, retiming and reshaping, and optical header computation. An all-optical inverter can be used as a building block to construct various other optical logic gates and signal processing devices, e.g., a nucleus of all-optical combinational as well as sequential digital logic circuits such as NAND gates, flip-flops, arithmetic logic units and microprocessors.

All optical logic devices can be built based on the optical bistability (OB) effect or cross gain modulation (XGM) in in-plane semiconductor optical amplifiers (SOAs) to demonstrate optical inversion. OB has been shown to require high set/reset powers. Because of the two terminal nature of the OB devices, such OB inverters were not cascadable and therefore had limited use. XGM has been more thoroughly investigated, primarily in SOAs using traveling wave structures in which an optical beam travels through a semiconductor gain medium with a single pass without being confined in the semiconductor gain medium by an optical cavity. Many SOAs in traveling wave structures exhibit high optical noise and consume greater than 100 mW per device. SOAs in traveling wave structures are edge emitting SOAs where light is directed into the SOA and exits SOA along a direction parallel to one or more active semiconductor gain layers and the underlying substrate. It can be difficult to use such SOAs to provide 2-D array integration capability and, as such, such edge emitting SOAs have limited use in optical devices and systems that require a large number of integrated components.

SUMMARY

This application describes, among others, implementations of vertical cavity semiconductor optical amplifiers for various photonic devices including all optical logic gate devices and oscillators.

In one aspect, an optical device is described to include an optical inverter. The optical inventor includes a vertical cavity semiconductor optical amplifier (VCSOA) that exhibits an optical gain within a gain spectral range and optical nonlinear bistability; an input optical module to couple, a first input optical signal at a first wavelength within the gain spectral range and a second input optical signal at a second wavelength within the gain spectral range, into the VCSOA to overlap with each other to cause a cross gain modulation on the first and second input optical signals; and an optical output module coupled to the VCSOA to select light from the first input optical signal output by the VCSOA as an output optical signal.

In another aspect, an optical inverter is described to include a vertical cavity semiconductor optical amplifier (VCSOA) that exhibits an optical gain within a gain spectral range and optical nonlinear bistability; an input optical module to couple, a first input optical signal in a first optical polarization and at a first wavelength within the gain spectral range and a second input optical signal in a second optical polarization orthogonal to the first optical polarization and at a second wavelength within the gain spectral range, into the VCSOA to overlap with each other to cause a cross gain modulation on the first and second input optical signals; and an optical output module coupled to the VCSOA to select light output by the VCSOA in the second optical polarization as an output optical signal.

In another aspect, a device is described to include an optical inverter which comprises a vertical cavity semiconductor optical amplifier (VCSOA) operable to be electrically energized to produce an optical gain which is within a gain spectral range and exhibits optical bistablility to have a low optical gain when input light is below a threshold optical power and a high optical gain is above the threshold optical power; a first optical input port coupled to the VCSOA to direct an input optical signal at a wavelength with the gain spectral range to the VCSOA and modulated to have a first optical power level that is below the threshold optical power and a second optical power level that is above the threshold optical power; a second optical input port coupled to the VCSOA to direct a CW optical signal at a wavelength with the gain spectral range to the VCSOA to spatially overlap with the input optical signal in the VCSOA to effectuate cross gain modulation on the CW optical signal and the input optical signal to produce an output optical signal from the CW optical signal with two modulated optical power levels that are complementary to optical power levels in the input optical signal; and an optical output port coupled to the VCSOA to receive the output optical signal.

In yet another aspect, a method is described to include directing an input optical signal at a wavelength with a gain spectral range of a vertical cavity semiconductor optical amplifier (VCSOA) electrically energized to produce an optical gain which exhibits optical bistablility to have a low optical gain when input light is below a threshold optical power and a high optical gain is above the threshold optical power; modulating the input optical signal to have a first optical power level that is below the threshold optical power and a second optical power level that is above the threshold optical power; and directing a CW optical signal at a wavelength with the gain spectral range into the VCSOA to spatially overlap with the input optical signal in the VCSOA to effectuate cross gain modulation on the CW optical signal and the input optical signal to produce an output optical signal from the CW optical signal with two modulated optical power levels that are complementary to optical power levels in the input optical signal.

Various devices based on techniques and designs described in this specification can be implemented to achieve various advantages, including Boolean inversion at high speeds, low power, workable noise margins for cascadability because of input output isolation, and easy of integration in large arrays.

These and other aspects and features and implementations of VCSOA-based devices are described in detail in the attached drawings, the detailed description, and the claims.

BRIEF DESCRIPTION OF DRAWINGS

FIGS. 5A, 5B and 5C show the operation of such a switch, the device layout of the switch and demonstration of the AND gate operation.

FIG. 6B.

FIGS. 16A and 16B show logic diagrams of VCSOA-based XOR and NAND gates, respectively.

DETAILED DESCRIPTION

This application describes, among others, examples of three-terminal optical inverters based on VCSOAs and its applications in constructing various optical devices. In such optical inverters, input and output signals are isolated from each other and the transfer characteristics can exhibit a sufficient sharp transition. Such three-terminal optical inverters can be configured to exhibit positive noise margins. In addition, three-terminal optical inverters can be used to facilitate cascadability of such optical inverters with positive noise margins and standardized logic levels. Because the power consumption and speed performance of such VCSOAs can dictate the functional complexity and the level of integration possible with such inverters, it is desirable to configure each VCSOA to have sufficiently low power consumption and sufficiently high switching speed.

In the described examples of three-terminal VCSOA inverters, an optical gain layer is provided in a Fabry-Perot resonator in a vertical cavity configuration and can be implemented in various forms, including but not limited to a single quantum well (QW) layer, a stack of multiple QW layers. The optical gain layer is electrically excited by an electrical current flowing through the one or more active QW layers supplied via top and bottom electrode contacts in the VCSOA. The VCSOA is designed to exhibit strong non-linear optical bistability (OB) which in turn facilitates the inverter operation. The non-linear optical bistability rises from dependence of the refractive index of the optical gain layer on the carrier concentration when the optical wavelength of the light is close to the forbidden band-gap. The optical properties of the input optical signal to the VCSOA, such as the optical wavelength, the optical power and the optical polarization, can be controlled to operate the VCSOA in an optical nonlinear bistable state to exhibit a low optical output as a logic low level when the optical power of the input optical signal is below a threshold power $I_{switching}$ and a high optical output as a logic high level when the optical power of the input optical signal is above the threshold power $I_{switching}$. One of the initial work on VCSOA as optical bistable devices includes an article entitled "Observation of bistability in a Vertical-Cavity Semiconductor Optical Amplifier (VCSOA)" by Wen et al. in Optics Express Vol. 10, No. 22, pp. 1273-1278 (2002).

Figure 1A:
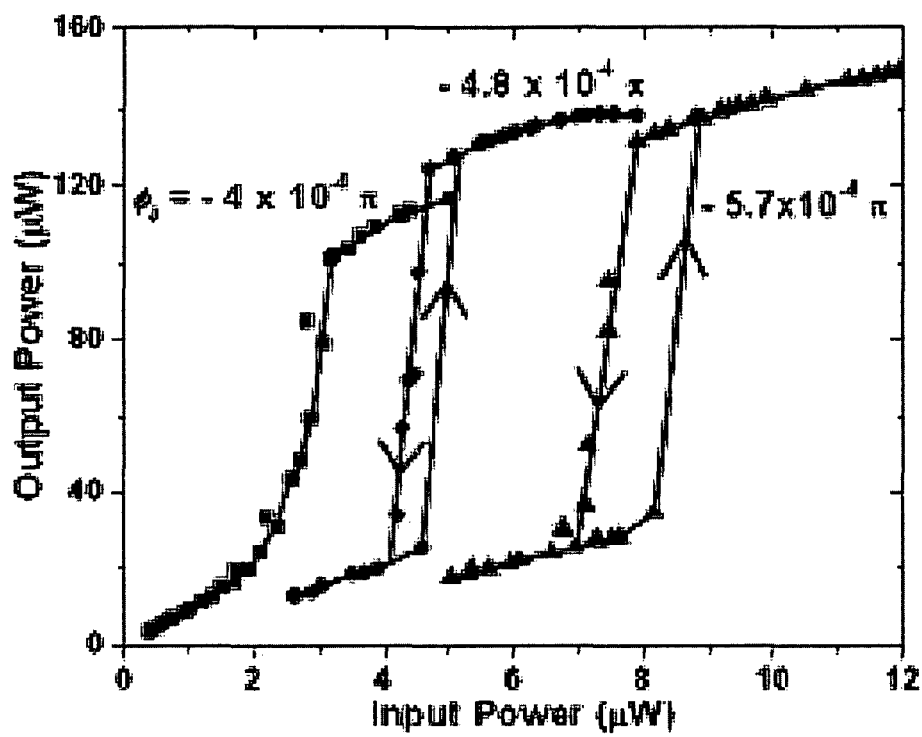
FIGS. 1A and 1B illustrate measured signals from a GaAs quantum-well vertical-cavity semiconductor optical amplifier (VCSOA) to show the optical stability, resonance wavelength pulling, and polarization gain anisotropy of the device.
Figure 1B:
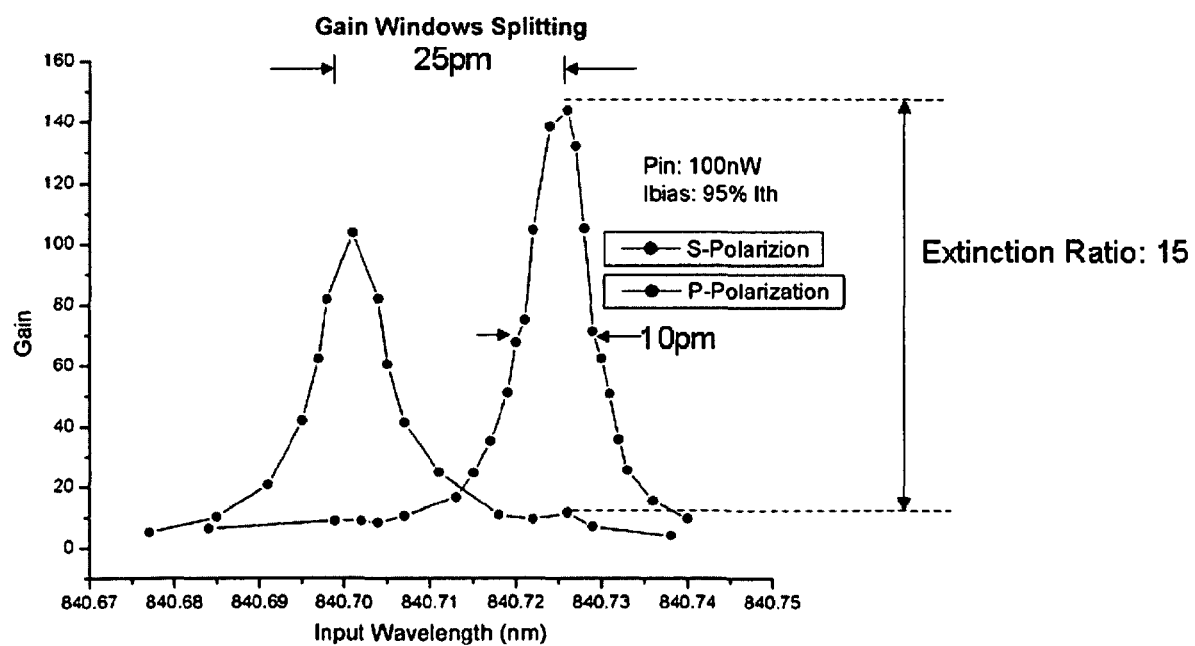

FIGS. 1A and 1B illustrate measured signals from a GaAs quantum-well vertical-cavity semiconductor optical amplifier (VCSOA) to show the optical stability, resonance wavelength pulling, and polarization gain anisotropy of the device. The VCSOA sample has a GaAs quantum well between two high-reflectivity distributed Bragg reflector (DBR) mirrors to form a high finesse Fabry-Perot cavity. The resonance wavelength is 850 nm. The top and bottom DBR mirrors consist of 22 and 30.5 pairs of quarter-wavelength thick high and low refractive index materials, respectively. Ion implantation was employed in the device to create crystalline damage around the active region. The resultant insulating material provides electrical confinement. The lasing threshold current of the VCSOA was about 5.6 mA at 297 K. The device substrate is not transparent at 850 nm and VCSOA was operated in reflection mode. During the measurements, the device was mounted in a temperature controlled holder with a precision of 0.01 C, in order to minimize thermal fluctuation.

FIG. 1A shows the optical transfer functions in form of the output power vs. input power for three different initial phase detuning values at $-4 \times 10^{-4}\pi$, $-4.8 \times 10^{-4}\pi$, and $-5.7 \times 10^{-4}\pi$, respectively. The device was biased at 95% of its threshold when those curves were measured. The measured hysteresis loops are counterclockwise. When the detuning is increased, the optical power required to achieve optical bistability increases accordingly and the hysteresis becomes wider. A bistable switching occurs with the input power of about 4 µW as the initial phase detuning was set to be $-4.8 \times 10^{-4} \pi$. Optical bistability reflects the resonance wavelength pulling in the VCSOA. Due to the dependence of refractive index on carrier concentration for wavelengths close to the forbidden bandgap, the two stable optical output states are associated with a single input state, depending on the switching history. Because the optical input can deplete the carrier concentration through stimulated emission, the length of the optical path of the cavity is a function of input intensity. Based on these mechanisms, the VCSOA shows the behavior of a negative nonlinear medium: when an optical input detuned to the long-wavelength side of the cavity resonance is fed into the amplifier, the resulting carrier depletion due to the increased internal intensity shifts the cavity resonance towards the input wavelength. This in return enhances the internal intensity, leading to a positive feedback loop or bistability. As a result, VCSOAs exhibit a very steep input-output transfer curve under certain operation conditions. This leads to achieving optical inversion with high noise margins. Various VCSOA devices were built and exhibited clockwise, two level power bistabilities (PB), multiple power bistabilities (MB), as well as wavelength bistabilities (WB). Clockwise hysteresis of WB was observed at constant input power while the input wavelength is swept across the gain window. MB is observed at a fixed operation wavelength biased on the long wavelength side of the two separated Polarization-Dependent Gain (PDG) windows of the VCSOA by sweeping the optical input. The polarization of the input is set to a fixed angle with respect to the two intrinsic principal axes of the VCSOA. Two MB levels were experimentally observed at 160 µW and 320 µW, respectively. In addition, we also examined the connection between PB and WB experimentally in a VCSOA for the first time. We have shown that the same bistable point is shared by both PB and WB. We have shown that these observations are in good agreement with our simulation model and may lead to multi-valued optical information manipulation.

The VCSOA devices also exhibit polarization gain anisotropy due to the semiconductor crystal anisotropy. The electro-optic and elasto-optic birefringence give rise to two orthogonally polarized modes and there is a finite difference between the resonant wavelengths in the two orthogonally polarized modes. This property of VCSOA provides a mechanism to combine two orthogonally polarized light beams as inputs and separate them later at the output by simply using a polarization beam splitter (PBS). In addition, the resonance wavelength splitting also allows independent adjustment of input wavelength and intensity to maximize the wavelength pulling effect possible, resulting in better optical inversion with higher noise margins. This feature can be used to achieve a 2-port inverter where the input signal is isolated from the output inverted signal and the optical bias. FIG. 1B shows a gain window splitting in an GaAs VCSOA sample.

Furthermore, we have also verified and experimentally demonstrated for the first time that counter-clockwise, clockwise and butterfly bistability in 1550 nm can be achieved in VCSOAs. Bistable operation was experimentally observed for bias currents ranging from 66-122% of threshold with switching powers as low as 2 µW. These switching powers are consistent with our measurements on optical bistability in 850 nm VCSOAs and provide an important step towards the realization of small footprint, low power optical logic/switching elements in the 1550 nm wavelength band. We have also demonstrated that all three forms of bistability occur over a wide range of operating conditions indicating that these devices may offer great flexibility for future applications.

In addition to the non linear optical bistability and polarization gain anisotropy, the present VCSOA optical inverters also operate based on cross gain modulation (XGM) when two input beams are directed into the VCSOA. When a semiconductor optical amplifier is pumped (optically or electrically), population inversion is achieved in the gain medium and electrons are excited into higher energy states. If an optical beam is input to the device, the excited electrons decay to their ground states and photons will be emitted in the process through stimulated emission which causes amplification of the input beam. However, when there are two different optical inputs, photons from different inputs are going to compete with each other for the same excited electron pool and this competition leads to gain competition and potentially gain saturation. Therefore, when the first optical input is a modulated signal while the second one is a continuous wave (CW) beam with a constant amplitude, the amplified second light at the amplifier output can be modulated by the modulation in the gain to acquire a modulation pattern that is complementary to the modulation pattern in the first optical input. As a result, the amplified second beam at the output has the inverted form of the first input signal.

Hence, the examples of the present VCSOA optical inverters described in this specification combine the non linear optical bistability, polarization gain anisotropy and cross gain modulation to provide practical all-optical inversion operations with high noise margins and simple and versatile input/output configurations and to allow for implementations in integrated 2-D arrays to achieve large-scale system operations. For example, implementations of the present VCSOAs can be configured to have small gain volume (e.g., 10 µm×10 µm×0.01 µm), and exhibit low input optical operation power (~10 uW) and strong XGM and resonance wavelength pulling to achieve a steep transfer curve and high noise margins. Implementations of the present VCSOAs can also be configured to have a short cavity length (e.g., one wavelength) to have a high bandwidth (e.g., at or greater than 50 GHz for high-speed processing applications. The input and output apertures in VCSOAs can be designed to be symmetric to minimize the coupling loss and to enhance system efficiency.

Figure 2A:
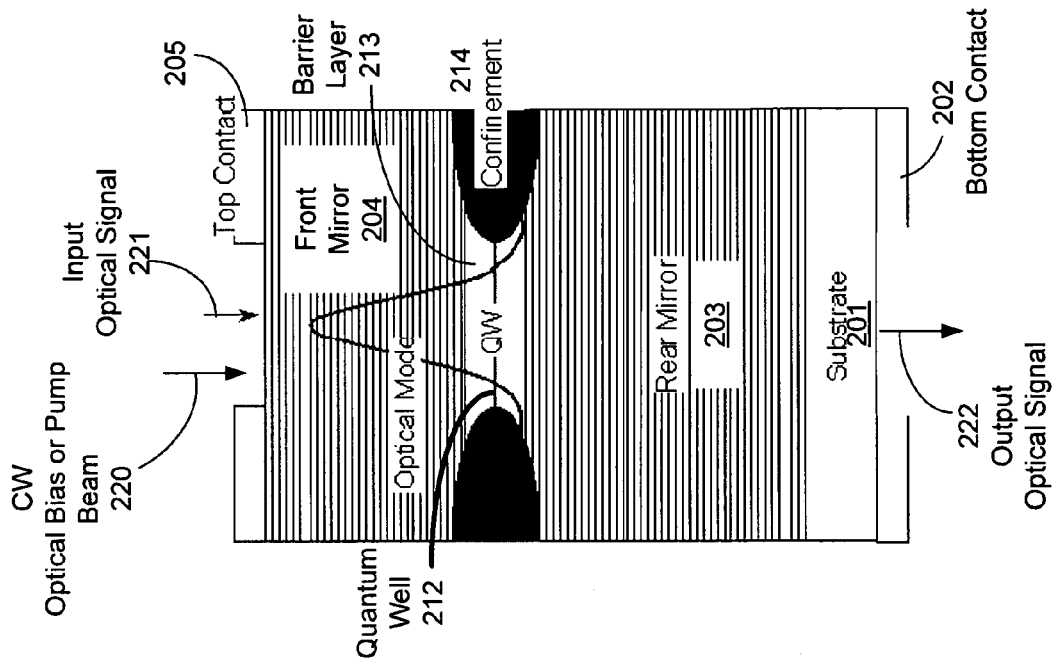
FIGS. 2A and 2B illustrate a reflective VCSOA inverter and a transmissive VCSOA inverter, respectively.

FIG. 2A illustrate an example of a reflective VCSOA inverter. The reflective VCSOA inverter is formed on a substrate 201 with a bottom surface and a top surface. The bottom surface is coated with a bottom contact electrode layer 202 and the VCSOA structure is formed on the top surface. The VCSOA structure includes a quantum well structure that includes an active QW structure 212 between a top barrier layer 213 and a bottom barrier layer 211. The active QW structure 212 can include one or more QW layers and provide an optical gain that amplifies input light through stimulated emission. Under different biasing conditions, the active QW structure 212 exhibits different gain coefficients. The dependence of the index of refraction of the gain medium on the carrier concentration causes the wavelength pulling effect which can be used to enhance the transition in the optical inversion. In VCSOAs, a gain medium can use a direct bandgap semiconductor material in the form of a quantum well structure, a bulk semiconductor; a quantum wire; quantum dots, and one or more PN junction. In some cases, the gain medium can also be composed of an indirect bandgap material when other physical processes such as Raman amplification are used as amplification mechanisms. In those cases, the gain medium can also be in the form of bulk, quantum well, quantum wire, quantum dots or one or more PN junctions.

Measurements shown in this specification were obtained from 850-nm GaAs VCSOAs. Other semiconductor materials can also be used to contruct VCSOAs designed for other wavelengths such as near UV, blue 430 nm, red 650-670 nm, and near infrared 920-980, 1310 and 1550 nm. The material systems the VCSOA inverters may include III/V compound semiconductors such as InP or GaN and/or group IV semiconductor material such as Si/Ge.

Each of the top and bottom barrier layers 213 and 211 can include one or more barrier layers. Carrier confinement regions 214 can be formed in the QW structure 212 and the barrier layers 211 and 214 to spatially confine the cross section of the current flow in a central region of the QW structure 212 to increase the current intensity and optical intensity in the central region of the QW structure 212. Ion implantation, oxide confinement and photonic crystals can be used to provide the electrical and/or optical confinement. In addition, other methods such as the tunneling-junction and low index surrounding structure (i.e. mesa structure) can also be used in order to provide electrical and optical confinement.

On top of the top barrier layer 213, a reflective stack 204 is formed as the front mirror and can be implemented by alternative dielectric layers to form a reflective distributed Bragg reflector (DBR). On the bottom side of the QW structure 212, a second reflective stack 203 is formed as the rear mirror and can be implemented by a second set of alternative dielectric layers to form a second reflective DBR. A top contact electrode layer 205 is formed on top of the front mirror 204 with an aperture for optical input and optical output. This device is designed to operate in a reflective mode where input and output beams are directed into and coupled out of the device via the front mirror 204. Hence, the substrate 201 may be optically opaque.

In operation, the VCSOA is biased electrically slightly below its lasing threshold to provide as much optical gain as possible without actually lasing. This condition also suppresses the optical noise. The actual bias point of the VCSOA may be increased (even above its lasing threshold) or decreased, based on performance tradeoffs (e.g. gain and noise). An electrical current is injected via the top and bottom contact electrodes 202 and 205 to electrically excite the QW structure 212. Two optical input beams 220 and 221 are provided to operate the VCSOA inverter in FIG. 2A. The first input beam 221 is an input optical signal, whose optical power level can be modulated to carry one or more optical logic states, and is directed into the VCSOA. The second input beam 220 is a CW optical beam and is also directed into the VCSOA as an optical bias or pump beam. The XGM in the one or more QW layers 212 in the VCSOA causes a modulated gain in the CW optical beam 220 in response to the modulation in the input signal 221. This produces power modulation in the CW optical beam 220 to produce an output optical signal 222 whose power levels are complementary or opposite to the optical power levels in the input optical signal 221. Hence, the output optical signal 222 is an "inverted" replica of the input optical signal 221. The front mirror 204 is partially reflective to allow optical transmission and the rear mirror 203 can have a high reflectivity to reflect received light back to the QW structure 212.

Figure 2B:
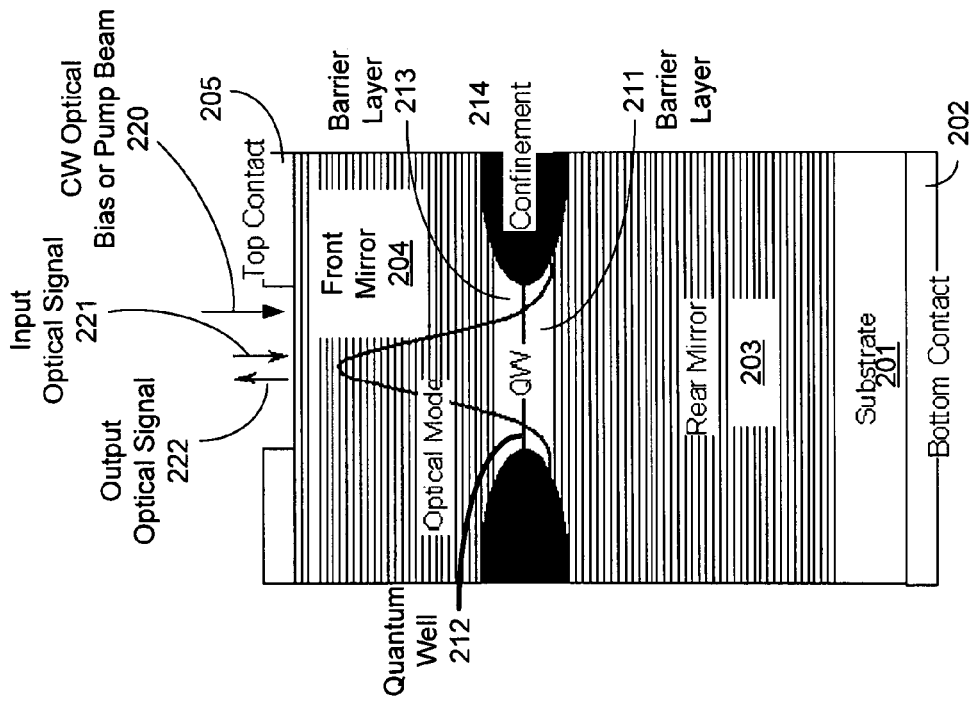

FIG. 2B shows a transmissive VCSOA inverter where the substrate 201 is optically transparent to transmit the output optical signal 222. The bottom contact electrode 202 is configured to have an aperture that permits transmission of the output optical signal 222. This design is different from the reflective VCSOA in FIG. 2A in that the input beams 220 and 221 are directed into the VCSOA from one side and the output beam 222 exits the VCSOA from the opposite side. The front mirror 204 and rear mirros 203 are partially reflective to allow optical transmission and are configured to have sufficient reflectivities to provide desired optical feedback in the vertical cavity resonator for optical amplification.

Figure 3A:
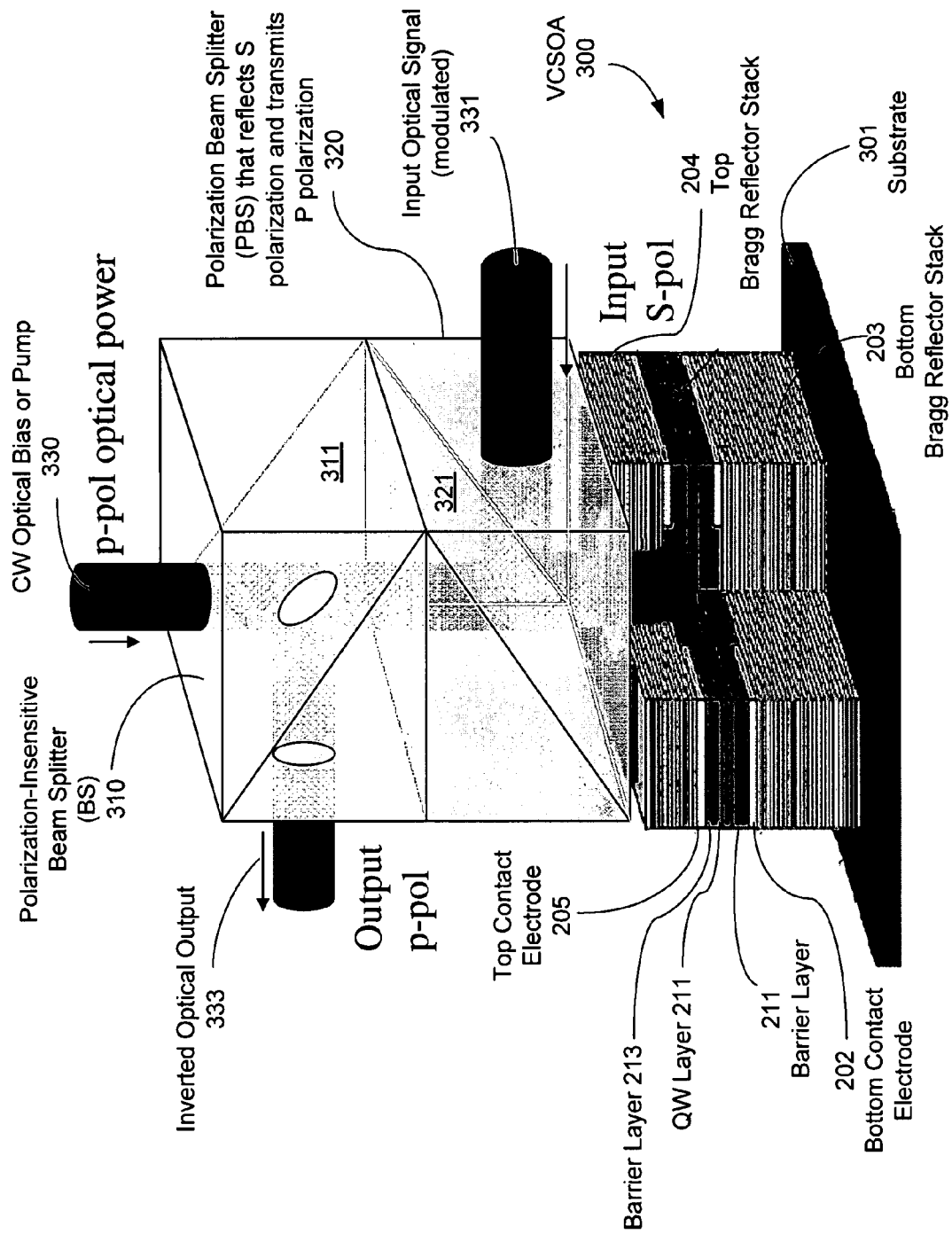
FIGS. 3A and 3B show two design examples for reflective VCSOA inverters using orthogonally polarized optical signal and optical pump beams.
Figure 3B:
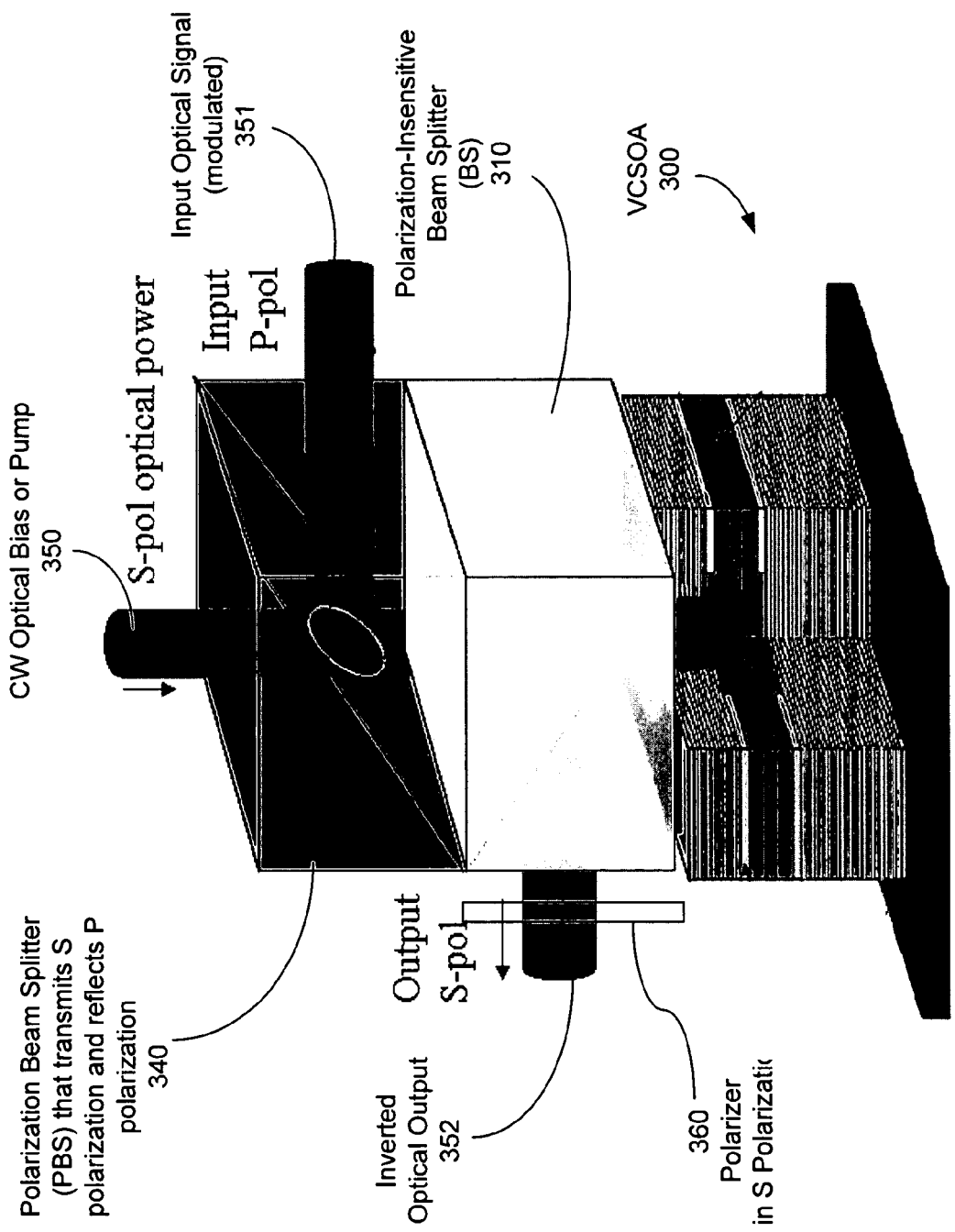

FIGS. 3A and 3B show two design examples for reflective VCSOA inverters using orthogonally polarized optical signal and optical pump beams to implement optical input and output. The VCSOA 300 in each of FIGS. 3A and 3B is shown to have a different VCSOA structure where the top and bottom contact electrodes 205 and 203 are formed over the between the top DBR 204 and the top barrier layer 213, and between the bottom DBR 203 and the bottom barrier layer 211. The bottom DBR 203 is formed over the substrate 301.

In FIG. 3A, two beam splitters 310 and 320 are used to form a polarization-selective optical Input/Output (I/O) port as a three-terminal device. The beam splitter 320 is a polarization beam splitter (PBS) is located on top of the VCSOA 300. The beam splitter 310 is a polarization-insensitive beam splitter and is located on top of the PBS 320. The PBS 320 has an optical facet as the first signal input terminal to receive an input optical signal 331 which is modulated in amplitude to carry optical pulses and the input optical signal 331 is controlled to be in a first selected input polarization, e.g., the S polarization as illustrated. The PBS 320 has a polarization selective reflective surface 321 that is oriented at a 45-degree angle to reflect light in the first selected input polarization towards VCSOA 300 and to transmit light in a polarization (e.g., the P polarization) orthogonal to the selected input the input beam 331. Therefore, the input beam 331 in the selected input polarization is reflected by the surface 321 and is directed into the VCSOA 300. The other polarization-insenstive beam splitter 310 is located above the PBS 320 and uses the top surface as the second input terminal to receive a CW optical pump beam 330 in a second selected polarization orthogonal to the first selected polarization for the input signal beam 331. The BS 310 has a polarization-insensitive reflective surface oriented at a 45-degree angle to transmit a portion of light (e.g., 50%) in the input CW pump beam 330 towards the PBS 320 and VCSOA 300. The transmitted CW pump beam 330 enters the PBS 320 and transmits through the polarization sensitive reflective surface 321 to enter the VCSOA 300. In the QW structure within the VCSOA 300, the transmitted CW pump beam 330 is modulated due to presence of the input optical signal 331 via XGM and the modulated pump beam 330 is reflected back toward the PBS 320 as the inverted optical output beam 333. At the polarization selective reflective surface 321, the inverted optical output beam 333 transmits through without reflection or with a minimal reflection. A portion of the inverted optical output beam 333 is reflected by the reflective surface 311 to transmit through a side facet of the BS 310 as the third terminal of the VCSOA inverter. The reflected light from the input optical signal 331, however, is reflected by the polarization selective reflective surface 321 due to its polarization and thus is blocked from entering the BS 310.

The optical I/O in FIG. 3B places a polarization insensitive BS 310 on top of the VCSOA 300 and a polarization-sensitive BS 340 on top of the BS 310. The PBS 340 has an optical facet as the first terminal to receive a CW optical pump beam 350 that is controlled to be at a first selected polarization (e.g., the S polarization) and a polarization selective reflective surface 353 that is oriented at a 45-degree angle to transmit light in the first selected polarization (e.g., the S polarization) and to reflect light in a second selected input polarization (e.g., the P polarization) orthogonal to the selected first polarization. A side facet of the PBS 350 facing the reflective surface 353 is used as a second terminal to receive the an input optical signal 351 which is modulated in amplitude to carry optical pulses and the input optical signal 351 is controlled to be in a second selected input polarization (e.g., the S polarization as illustrated) orthogonal to the first selected polarization. Under this configuration, the input signal beam 351 is reflected at the surface 353 towards the BS 310 and the VCSOA 300. The XGM in the VCSOA 300 modulates the CW pump beam 350 to produce the inverted optical beam 352 that is reflected towards the PS 310. A portion of the inverted optical beam 352 is reflected by the reflective surface in the BS 310 to a side facet of the BS 310 as the third terminal of the device. The reflected input optical beam 351 is partially reflected to the third terminal and the remaining part enters the PBS 350. Hence, different from the design in FIG. 3A, the output terminal has both the inverted optical beam 352 and the light from the input optical signal 351. These two beams are orthogonally polarized and hence a linear polarizer 360 in the first selected polarization (e.g., the S polarization) can be placed at the output path to block the reflected input optical beam 351 so that the output of the polarizer 360 contains only light from the inverted optical beam 352.

In both FIGS. 3A and 3B, the two input beams are aligned to overlap with each other in the VCSOA 300 to maximize the optical efficiency of the VCSOA 300. In reflection mode in FIG. 3A, the signal(s) enter and exit from the same DBR mirror while in transmission mode, the signal enters into a VCSOA from one DBR mirror and exits from the other. For VCSOAs operated in reflection mode in FIG. 3A, the bottom mirror reflectivity should be as high as possible while the top mirror reflectivity could be reduced slight from its maximum value in order to have higher gain and lower noise figure. This can be achieved by removing a few quarter-wavelength material stack pairs from the top DBR. For VCSOAs operated in transmission mode in FIG. 3B, it is desirable for the top and bottom mirrors to have the same reflectivity.

In the above VCSOA inverter designs, the VCSOA can be configured and operated to exhibit a nonlinear optical gain which varies with the power level of the input light. In the specific examples described below, the optical properties of the input optical signal, such as the optical wavelength, the optical power and the optical polarization, can be controlled to operate the VCSOA in an optical nonlinear bistable state to exhibit a low optical output as a logic low level when the optical power of the input optical signal is below a threshold power $I_{switching}$ and a high optical output as a logic high level when the optical power of the input optical signal is above the threshold power $I_{switching}$. The power modulation in the input optical signal is controlled so that the low power level in the input signal is below the threshold power $I_{switching}$ and the high power level in the input signal is above the threshold power $I_{switching}$. Hence, different from many other XGM SOAs operating in a linear gain state where the optical gain is approximately a constant for different input power levels, the present VCSOA exhibits the nonlinear bistability and has at least two states for the optical gain. It is under this highly non-linear or bistable condition that the XGM is applied to the CW optical beam. Under this configuration, the noise margin (NM) of the VCSOA inverter is defined as $$NM(\text{Low}) = I_{switching} - Io(\text{low}), \text{ and}$$

$$NM(\text{high}) = Io(\text{high}) - I_{switching},$$

where Io(low) is the low power level of the output optical signal and Io(high) is the high power level of the output optical signal. The combination of the XGM and highly nonlinear optically bistable response produce a large noise margin that is difficult to achieve in other XGM SOA devices. The improved noise margin in the present VCSOA devices can be used to achieve certain beneficial features, including cascading two or more such VCSOA inverters to form other logic gates.

The examples of VCSOAs can be used in various configuration and combinations to construct all optical inverters and to provide sequential and combinatorial photonic logic circuits and their chip level communication and integration. Certain implementations of devices based on the example VCSOAs described here can be configured to perform high speed sequential and combinatorial logic and memory operations with low optical powers (e.g., about 10 µW), high data rate (>40 Gb/s) and at low cost with high integration densities ($10^4$ devices/cm$^2$).

In the above illustrated VCSOA inverters, a combination of VCSOA properties including cross gain modulation, bistability and polarization gain anisotropy is used to achieve desired optical inversion. Strong optical bi-stability coupled with cross gain modulation and polarization gain anisotropy in a VCSOA (biased below threshold) results in gain competition and saturation between two orthogonal input polarizations that share the same excited electron pool caused by electrical pumping. The combination of these three effects ensures that a VCSOA (biased below threshold) combined with a polarization beam splitter (PBS) behaves as a near ideal optical inverter exhibiting very steep inverted input-output transfer characteristics and an ultrafast response. In addition these inverters are fully cascadable and hence various sequential and combinatorial logic and memory circuits such as all optical flip-flops and NOR gates can be implemented by simply connecting the VCSOA inverter in various circuits.

A variety of photonic circuits can be constructed based on the present VCSOA devices. Examples include VCSOA inverters, optical switches, NOR gates and NAND gates, optical oscillators, and optical flip-flop circuits.

In FIGS. 3A and 3B, the optical input signal at a given polarization directed into the VCSOA prints its inverted signal to a second input beam as optical bias or pump beam that has an orthogonal polarization with respect to the first input. Strong cross gain modulation of the gain medium coupled with optical bistability and polarization gain anisotropy results in high quality optical inversion in VCSOAs with a simple and compact input-output coupling configuration. When combined with a PBS, VCSOA based inverters exhibit excellent transfer characteristics and isolated input-outputs providing excellent noise margins demonstrating their cascadability. The optical response times of some VCSOAs have been measured to be in the 10's of picoseconds so that we expect optical photonic circuits based on VCSOAs to be able to handle large bandwidth signal. In addition, VCSOA inverters exhibit useful features: low optical bias powers (~30 µW/inverter) and electrical power (~2 mW/inverter); capability of being integrated in large scale 2-dimensional device array (32×32) due to intrinsic vertical-cavity structure; efficient coupling owing to its small geometry and circular aperture; and, low cost resulting from wafer level processing and testing. It is possible to use the present VCSOA inverters to implement optical SRAMs with capacity of 1 kb storage per chip (4 mm on the side) dissipating 2 Watts electrical power and 100 mW total optical power, with serial data rates of 40 Gb/s.

In FIG. 3A, an input optical signal in s-polarization state and modulated in time is coupled into a VCSOA via a polarizing beam splitter. A p-polarized optical beam (CW) referred to as the bias or pump is also coupled into the VCSOA that is electrically biased near threshold. As a result of the amplification of the VCSOA an amplified version of the input signal is available in s-polarization and is reflected back by the PBS in the direction of the input. Because of the polarization dependent cross gain modulation of VCSOA, the inverted input signal is also imprinted on the p-polarized bias or pump beam. The p-polarized inverted signal is separated or isolated from the s-polarized non inverted signal by the polarizing beam splitter. The bistability of the VCSOA ensures sharp transfer characteristics for the inverter.

Figure 4A:
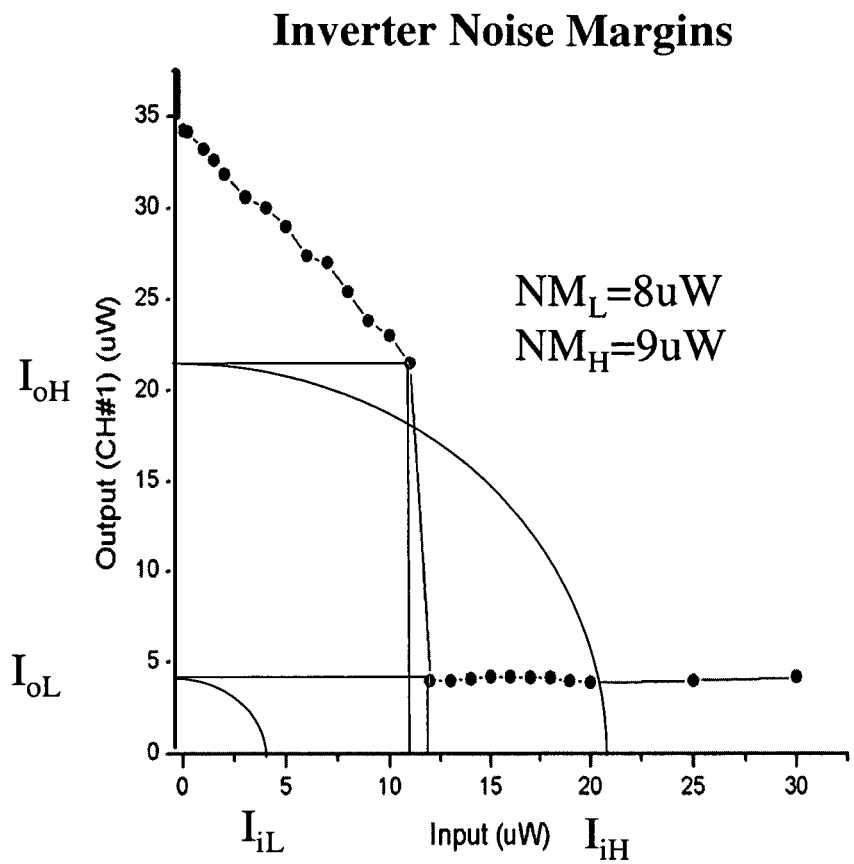
FIGS. 4A, 4B and 4C illustrate operations of the reflective VCSOA inverters in FIGS. 3A and 3B.
Figure 4B:
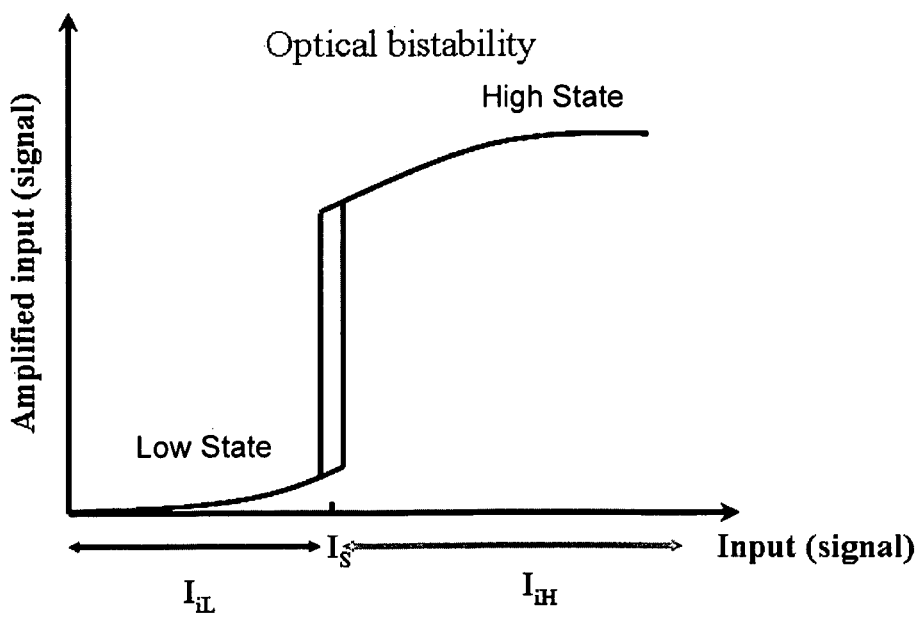

FIG. 4A is the measured transfer characteristics of the VCSOA inverter and FIG. 4B illustrates the optical bistable gain input signal from the VCSOA. The physical mechanism of the optical bistability in a SOA mainly rises from the dependence of the refractive index on the carrier concentration for wavelengths close to the forbidden band-gap. Since the optical input can deplete the carrier concentration through stimulated emission, the length of the optical path of the cavity is a function of input intensity. When an optical input detuned to the long-wavelength side of the cavity resonance is fed into the amplifier, the resulting carrier depletion due to the increased internal intensity shifts the cavity resonance towards the input wavelength. This in return enhances the internal intensity, leading to a positive feedback loop and abrupt increase in optical gain. Therefore, there exist two states of amplified signal: $I_{iL}$ and $I_{iH}$ as shown in FIG. 4B where $I_S$ is the bistability switching power. For example, when the input signal having power within the range of $I_{iL}$ is coupled into the VCSOA inverter, the gain for this input signal is low and the gain for the pumping (bias) beam is high resulting in a logic high output state of an inverter. When the power of the input signal is increased and becomes above the bistability switching power, abrupt increase in optical gain for the input signal leads to a sharp decrease at the inverter output (along the orthogonal polarization) through the XGM. To this end, the polarization, wavelength and power of signal and pump (bias) beams need to be adjusted properly.

Figure 4C:
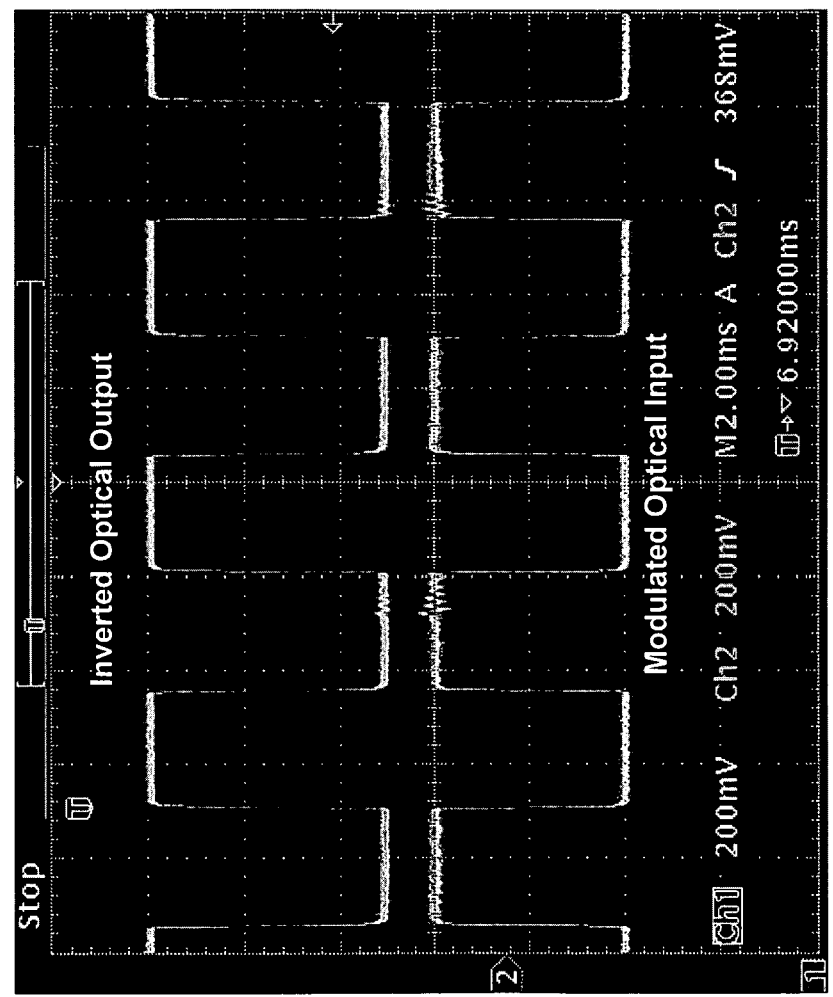

FIG. 4C shows the oscilloscope traces of the input and output (inverted) signals obtained from a sample VCSOA inverter based on a design in FIGS. 3A and 3B.

The above VCSOA designs can be optimized using newly developed nanophotonics and photonic crystal techniques to provide significant reduction in electrical power dissipation, e.g., a reduction by 100 fold in a few years.

Various VCSOA-based devices can be constructed based on the present VCSOA inverters. Examples of such devices include VCSEL based optical amplifier (VCSOA), nanowire lasers and photonic crystal lasers as amplifiers.

The optical cavity in VCSOAs provides a positive feedback mechanism and enhances the stimulated emission. The optical cavity determines, in combination with other device parameters and operation conditions, the gain window profile, noise figure and the device speed. For VCSOAs as inverters, the cavity structure mainly affects the inversion noise margins and operation speed. In addition to the DBR structure, the following structures may also be used to form a cavity in a VCSOA: Semiconductor cleaved facet; Distributed feedback structure (DFB); dielectric multilayer structure; and photonic crystal reflectors. The vertical structure design can be used to ensure the 2-D device array fabrication capability. In addition to the structures illustrated in the figures attached here, a 45°-mirror can be placed at the in-plane output of an edge-emitting SOA.

The pumping method determines how the electrons in the gain region are pumped into their excited states which in turn amplify the input signals. The electrical pumping is commonly in optical inverters due to its simplicity, optical pumping can also be used alone or in combination with the electrical pumping to achieve electron excitation. VCSOAs can be biased below the lasing threshold to avoid lasing while the spontaneous emission is suppressed by relatively strong stimulated emission caused by the optical feedback provided by the VCSOA cavity. The threshold power of the VCSOA determines its electrical power dissipation. Modification of the VCSOA structure using photonic crystal technology can be used to scale down VCSOA inverters.

The VCSOA inverters illustrated in this specification use too independent optical inputs to perform the optical inversion. In order to discriminate the two optical inputs, two orthogonally polarized beams with the same or different wavelengths are used to take the advantage of the polarization gain anisotropy in VCSOAs. Two optical inputs with different wavelengths and/or different phases may also be used in VCSOA inverters. In addition, one of the input optical signals has a constant intensity for optical inverter operations. In other applications such as optical switching, both input optical signals can be modulated.

In implementations, both free space components and waveguide structure including fiber can be used to couple inputs into and outputs out of the VCSOA inverters. In addition, evanescent coupling of optical radiation from one VCSOA device or circuit to another can establish communication between nearest neighbor devices and circuits. This will be further discussed bellow in systems integration. VCSOAs with a small aperture size and single fundamental lasing mode are preferred as optical inverters due to low power consumption and less noise added to the input signals. VCSOAs with large aperture sizes that support higher order modes can also be used since the output mode(s) are mainly determined by the mode(s) at the input.

VCSOA based microphotonic combinatorial logic circuits can be constructed based on VCSOA designs described in this application. Optical logic gates such as NOR, NAND, and XOR gates can be built from VCSOA inverters, and these gates, in turn, may be used as building blocks to implement other higher-level logic. To describe these circuits we represent the photonic inverter with a symbol. We also provide a specific photonic circuit implementations.

EXAMPLE 1

Optical Switch (Transmission Gate)

When the bias input of the VCSOA inverter is modulated the input signal transmission through the gate can be controlled via the bias input. The amplified non inverted output of the circuit will than be the AND combination of the input signal and the control signal (gate signal). At the inverted output of the circuit one also obtains the inverted input signal that is AND'ed with the gate signal. These operations become possible because the transfer characteristics of the VCSOA can be shifted (controlled) by the intensity applied to the bias input (gate). This circuit essentially can be operated as an optical switch for modulation of photonic signals, as a transmission gate, as well as a logic circuit for implementing more complex logic functions.

FIGS. 5A, 5B and 5C show the operation of such a switch, the device layout of the switch and demonstration of the AND gate operation.

EXAMPLE 2

Microphotonic NOR Gate

Optical NOR gate can be implemented based on the VCSOAs in this application. Table 1 shows the truth table for a NOR gate and FIGS. 6A and 6B illustrate two schematic configuration using the photonic inverter symbol of a NOR gate.

Figure 6A:
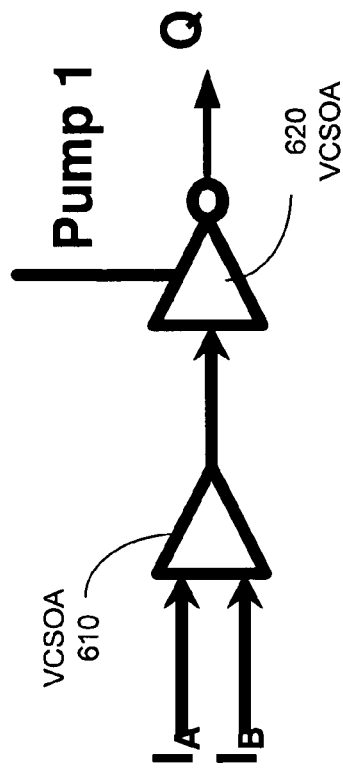
FIGS. 6A and 6B illustrate two schematic configuration using the photonic inverter symbol of a NOR gate

In FIG. 6A, the first VCSOA 610 is operated in its bistable region and has a transfer characteristic as shown in FIG. 4A. When two inputs have power higher than the switching threshold, the first VCSOA 610 acts as an optical OR gate. The output from the first VCSOA 610 then is inverted by the second VCSOA inverter 620. This combination effectuates an NOR operation.

Figure 6B:
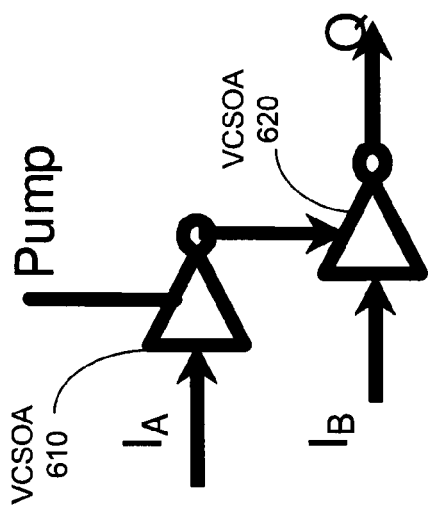

FIG. 6B shows an alternative configuration of an optical NOR gate that uses the transmission gate described above. The output of the first VCSOA inverter 610 is fed into the transmission gate 620 as its control signal. The gate output is $Q=I_A'$ AND $I_B'=I_A$ NOR $I_B$, implementing logic NOR operation. For both cases, isolators can be used to prevent light from propagating backwards and generating instability in the VCSOAs.

TABLE 1

Truth Table for Optical NOR Gate

| Input A | Input B | Output Q |
|---------|---------|----------|
| 0 | 0 | 1 |
| 0 | 1 | 0 |
| 1 | 0 | 0 |
| 1 | 1 | 0 |

Figure 6C:
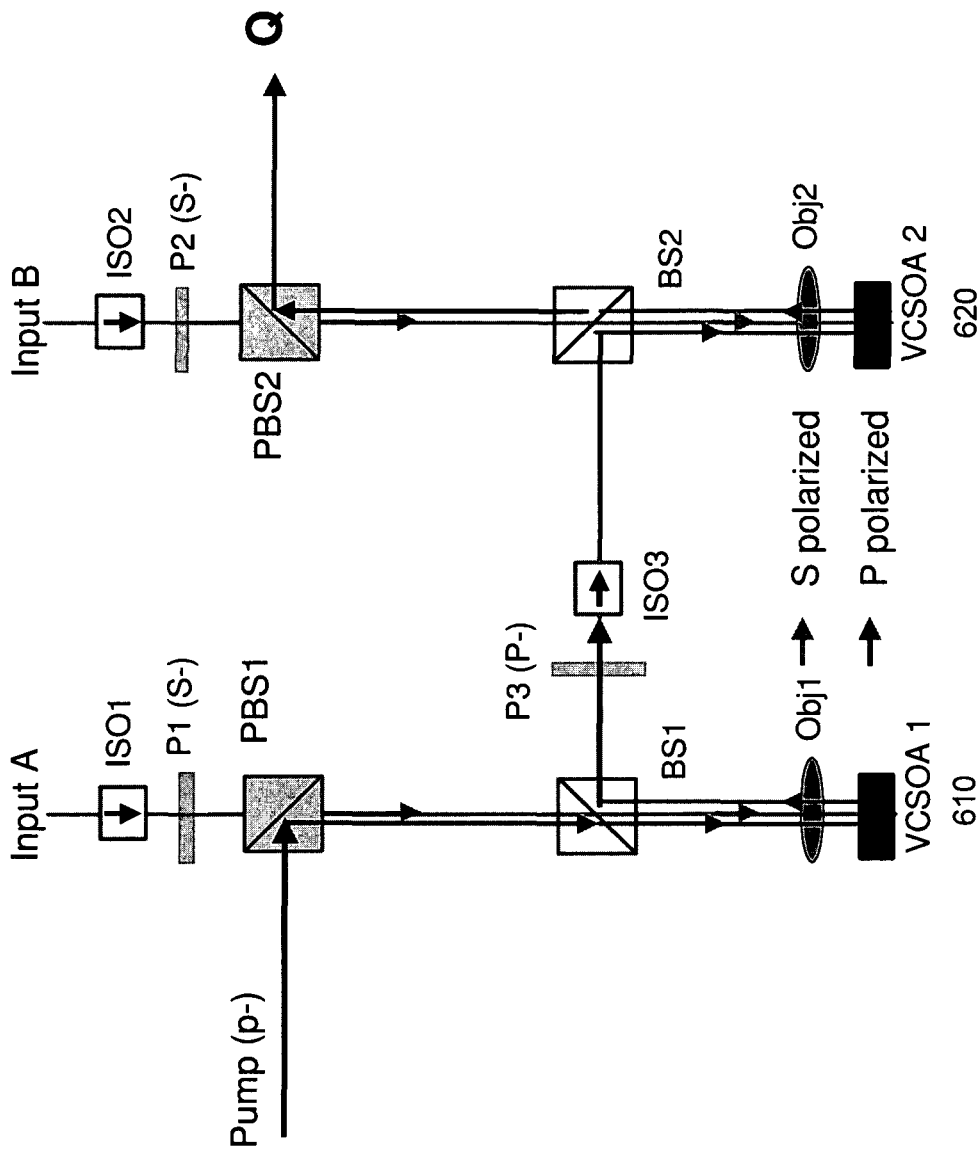
FIG. 6C shows a free-space optical circuit implementation of a NOR gate symbolically shown

FIG. 6C shows a free-space optical circuit implementation of a NOR gate symbolically shown FIG. 6B, in which ISO 3 (isolator) and p3 (polarizer) are used to prevent the output from VCSOA 2 from coupling back into VCSOA1 through BS1 and BS2; PBS 1 (Polarizing beam splitter) combines the optical bias (pump) and input A based on their polarizations without introducing extra optical loss (BS causes at least 3 dB loss); PBS2 separates the output from VCSOA 2 (p-polarized) and input B based on their polarizations without introducing extra optical loss. Alternatively, the NOR gate design can be implemented with waveguide and fiber based components.

EXAMPLE 3

Optical NAND Gate

Figure 7A:
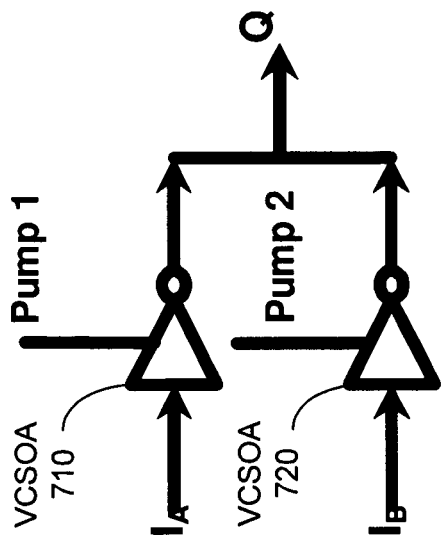
FIGS. 7A and 7B show examples of optical NAND gates based on two or three VCSOAs.
Figure 7B:
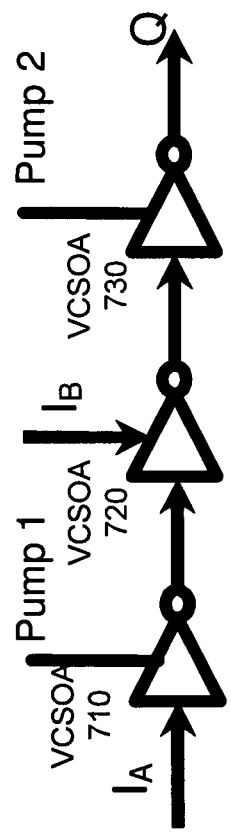

Optical NAND gate can be implemented as shown in FIGS. 7A and 7B with two or there VCSOAs. TABLE 2 shows the truth table for a NAND gate and FIGS. 7A and 7B illustrate two exemplary configurations of NAND gate based on VCSOA inverters.

In FIG. 7A, two inverter outputs from VCSOAs 710 and 720 are combined constructively at Q. In order to work properly, two outputs from inverters 710 and 720 need to be coherent and in-phase. One way to achieve this is to make pumps to two inverters be coherent and in-phase and two combining arms identical or in-phase.

FIG. 7B shows an alternative configuration of optical NAND gate. The first two cascaded inverters 710 and 720 implement an optical AND gate while the third gate 730 inverts the output of this AND gate achieving a NAND operation optically. For both cases, isolators can be used to prevent light from propagating backwards and generating instability.

TABLE 2

Truth Table for an NAND gate

| Input A | Input B | Output Q |
|---------|---------|----------|
| 0 | 0 | 1 |
| 0 | 1 | 1 |
| 1 | 0 | 1 |
| 1 | 1 | 0 |

Figure 7C:
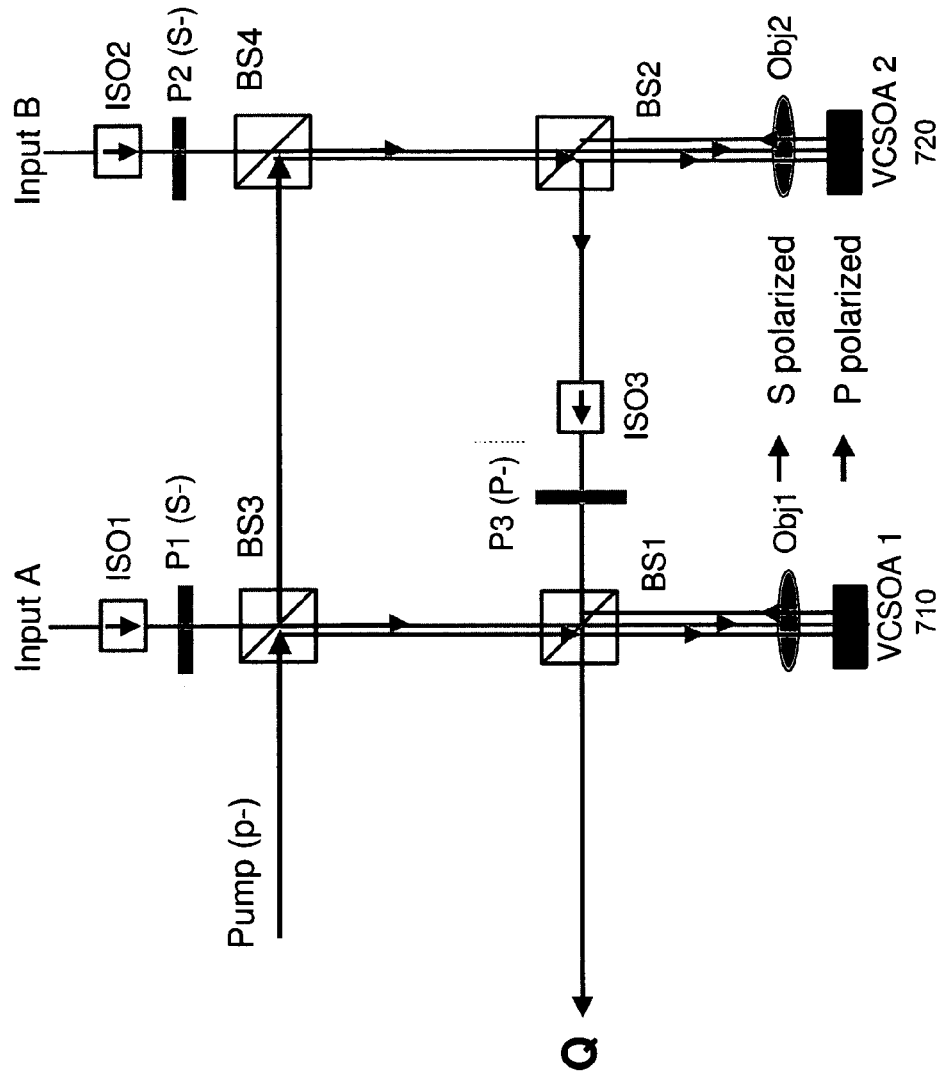
FIG. 7C is an implementation of the circuit in FIG. 7A in an optical setup.

FIG. 7C is an implementation of the circuit in FIG. 7A in an optical setup. In this example, optical isolator ISO 3 and optical polarizer P3 are used to prevent input A and pump from directly coupling into VCSOA2 through beam splitters BS1 and BS2. Outputs along p-polarization from VCSOA1 and VCSOA 2 need to be in phase, and the difference in optical paths needs to be $n\lambda$, where $\lambda$ is the operation wavelength and n is a positive integer. Alternatively, the design can be implemented with waveguide and fiber based components.

EXAMPLE 4

XOR and XNOR Circuits

Figure 8:
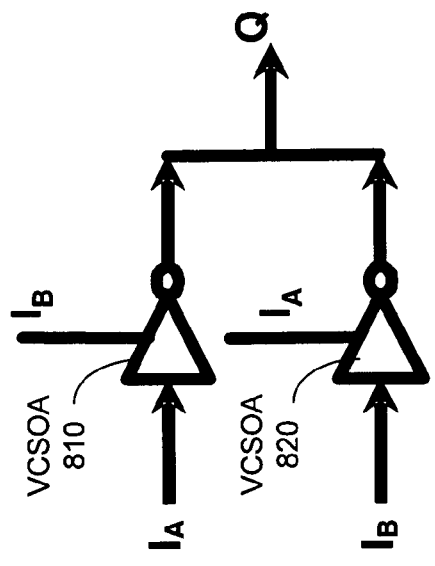
FIG. 8 shows exemplary XOR Gate based on the present VCSOA design with two VCSOA inverters.

Combinations of the transmission Gates inverter and NOR gates can be used to construct various implementations of XOR and XNOR gates. FIG. 8 shows exemplary XOR Gate based on the present VCSOA design with two VCSOA inverters 810 and 820.

EXAMPLE 5

Microphotonic Oscillator Circuits-Optical Ring Oscillator

Figure 9:
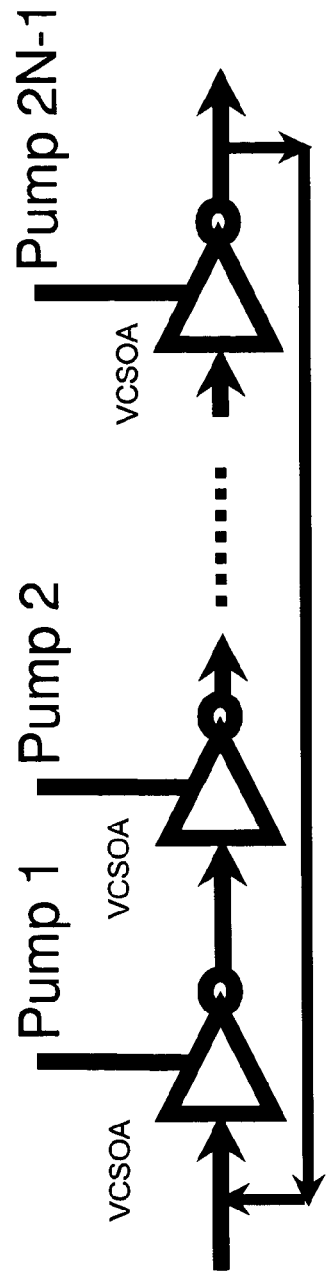
FIG. 9 shows an optical ring oscillator in which an odd number of VCSOA inverters are cascaded and the output of the last inverter is fed to the input.

FIG. 9 shows an optical ring oscillator in which an odd number of VCSOA inverters are cascaded and the output of the last inverter is fed to the input. N is a positive integer. Optical isolator and PBS can be used in this configuration to ensure the unidirectional propagation of light as shown.

Figure 10:
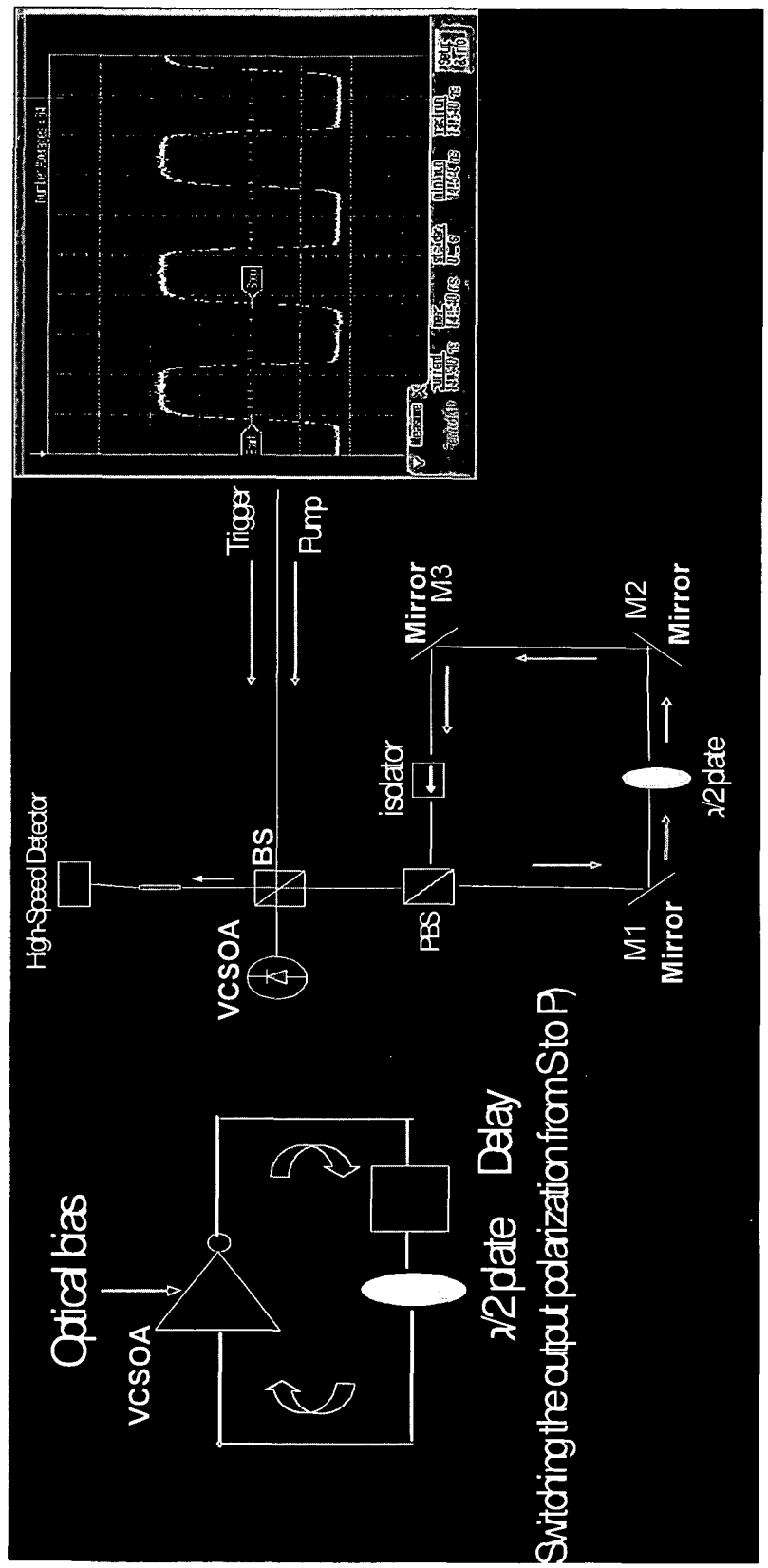
FIG. 10 shows a single stage oscillator circuit based on a VCSOA inverter.

A single stage oscillator circuit can also be realized with a VCSOA inverter as shown in FIG. 10. The left figure in FIG. 10 shows the layout of the ring oscillator; the middle figure shows a free-space implementation; and the right figure shows an measured oscillator output from the free-space implementation of the ring oscillator. The number of VCSOAs is an odd number in an optical oscillator. Reflectors M1, M2, M3 and PBS form an optical loop providing the required optical delay with minimum optical loss. The half-wave plate is inserted in the loop to change p-polarized light to s-polarized light so that the light can be fed back to the VCSOA via the PBS to generate the optical oscillation. The optical isolator ISO in the loop blocks the output light polarized along s-direction preventing possible interference between s-polarized output (changes to p- after passing through the half wave plate) and pump.

Alternatively, the design can be implemented with waveguide and fiber based components.

EXAMPLE 6

Microphotonic Sequential Logic Circuits: Optical Flip-Flop

Figure 11A:
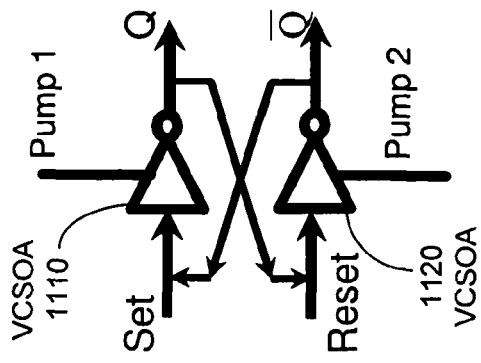
FIG. 11A shows an example of an optical flip-flop.

FIG. 11A shows an example of an optical flip-flop. Two VCSOA inverters 1110 and 1120 and associated PBSs are cascaded as illustrated where the output of one inverter is fed intentionally back to the input of the other inverter forming an optical cross coupled circuit capable of storing one bit of information.

Figure 11B:
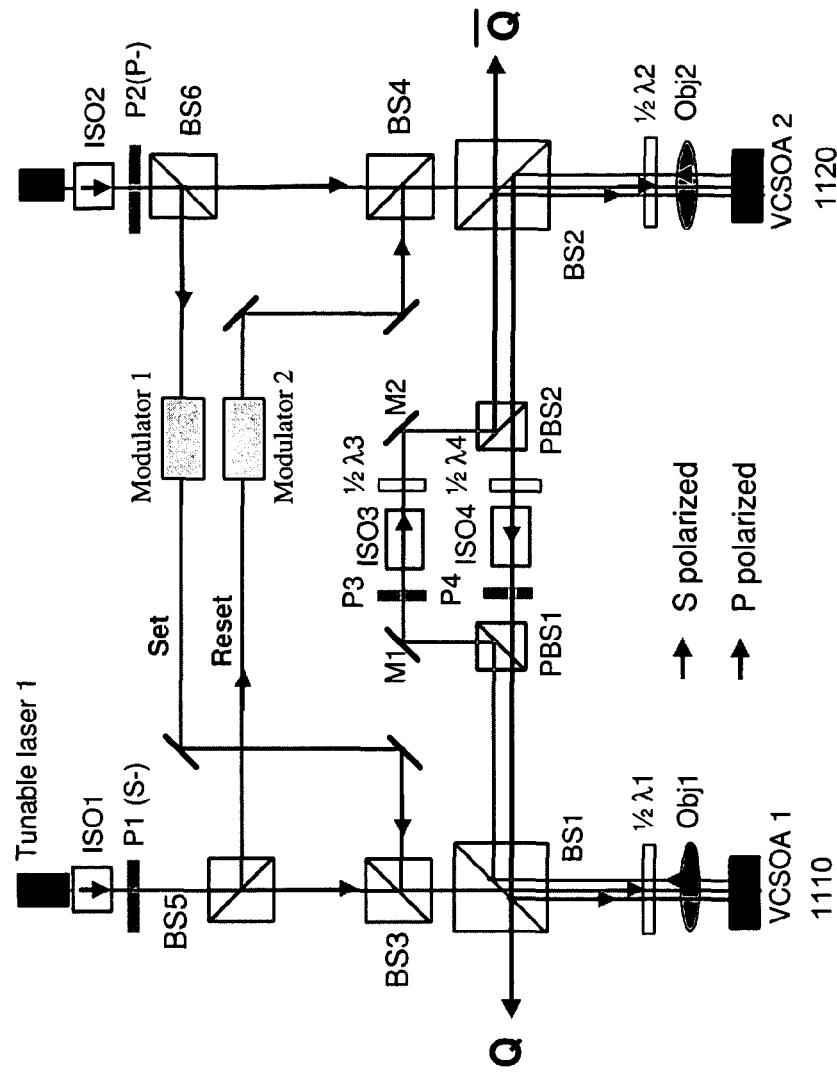
FIG. 11B shows a free-space implementation of the device in FIG. 11A.

FIG. 11B shows a free-space implementation of the device in FIG. 11A. Optical isolator and PBS are used to ensure the unidirectional propagation.

Figure 11C:
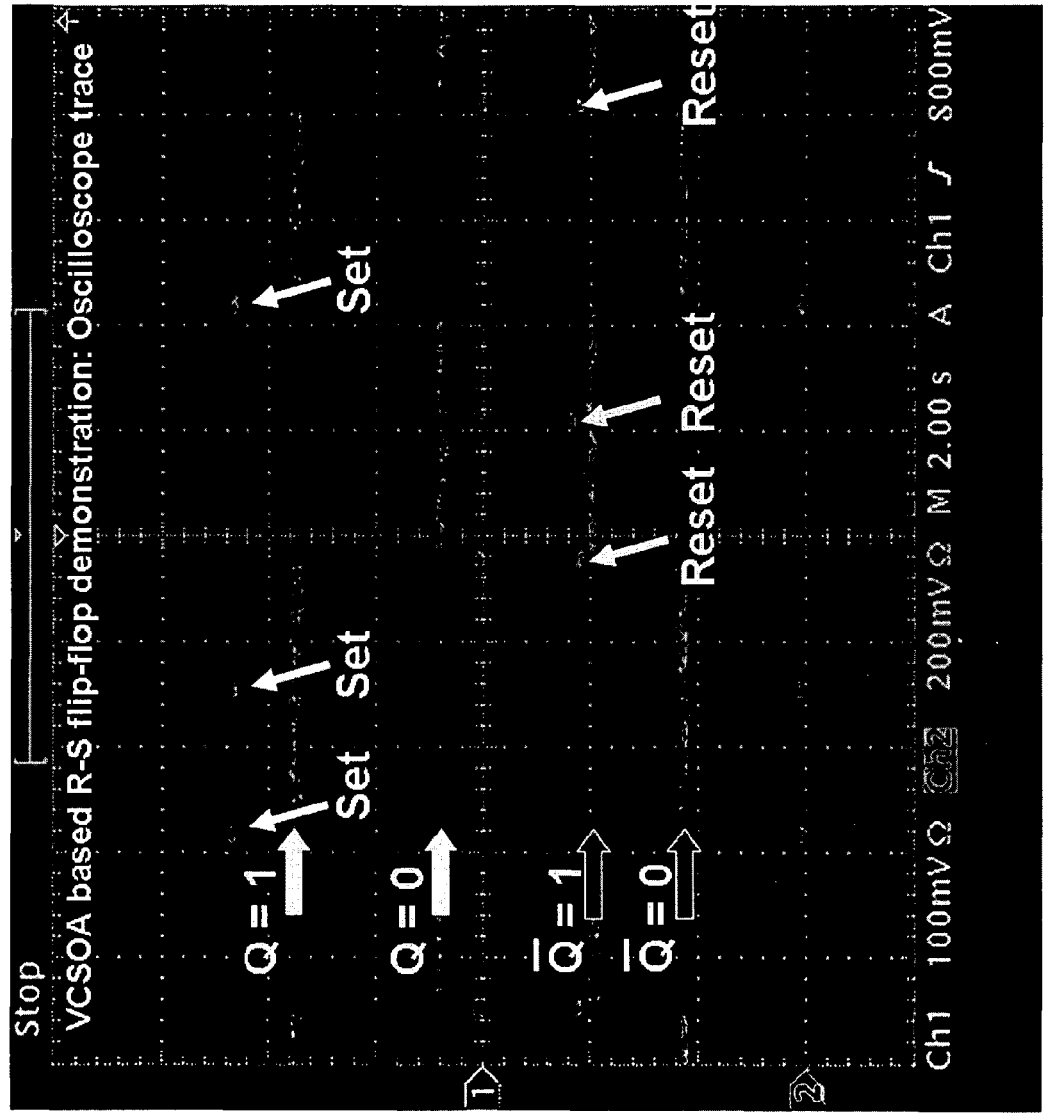
FIG. 11C shows the oscilloscope trace showing the successful operation of the device in FIG. 11B.

FIG. 11C shows the oscilloscope trace showing the successful operation of the device in FIG. 11B. M1, M2, PBS1 and PBS2 form an optical separation loop allowing the counter-propagating light between VCSOA1 and VCSOA 2 to travel along different optical paths based on their propagation direction. ISO3, P3 and ISO4, P4 are used to make sure that only the signals with desired polarization propagate along the right directions. The half-wave plates 1–4 ensure the polarizations of the signals and pumps are orthogonal to each other at the VCSOAs.

Alternatively, the design can be implemented with waveguide and fiber based components.

EXAMPLE 7

Integration of Microphotonic Flip-Flop

Figure 12:
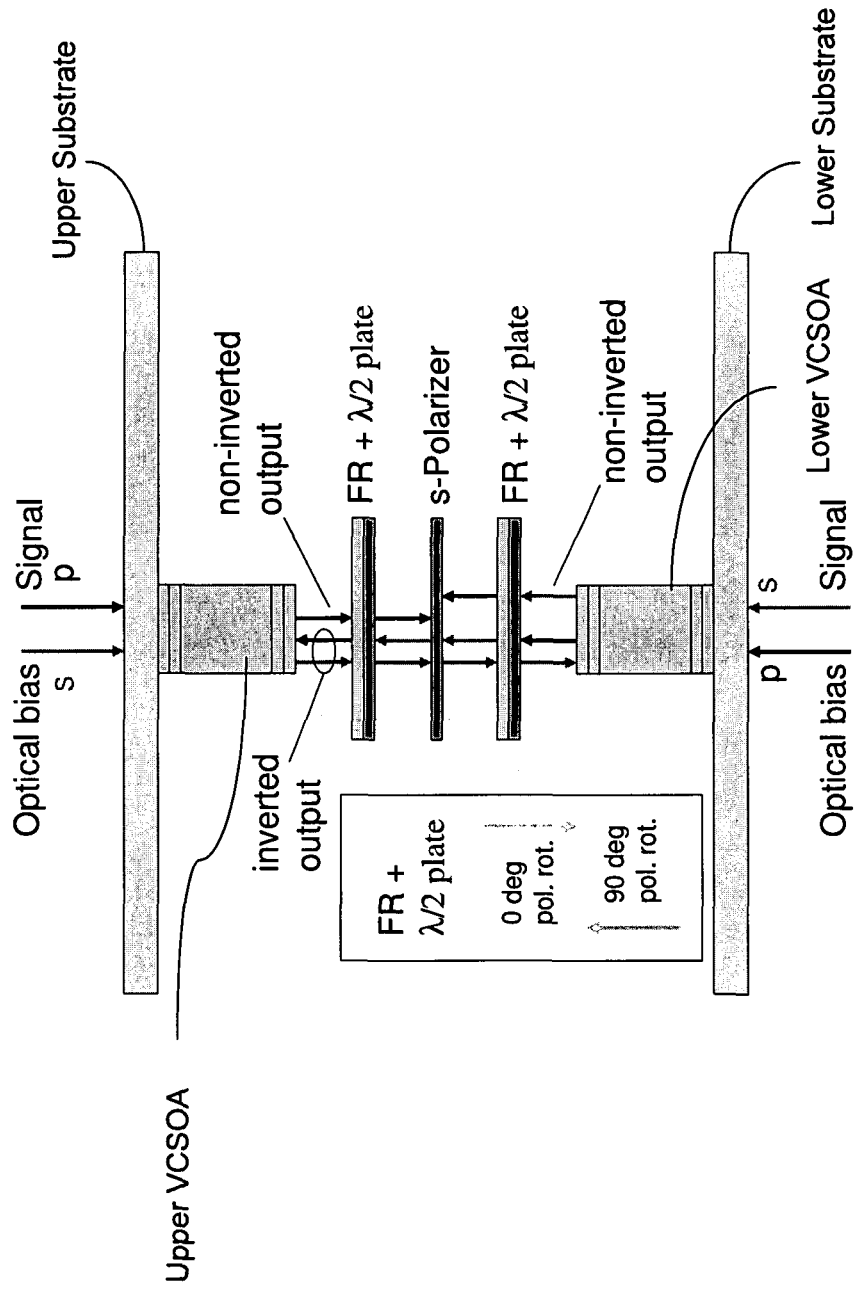
FIG. 12 shows that the number of components needed for an array of flip-flop can be decreased by using VCSOAs fabricated on transparent substrates and using thin film isolators and polarizers and half wave plates.

The number of components needed for an array of flip-flop can be decreased by using VCSOAs fabricated on transparent substrates and using thin film isolators and polarizers and half wave plates as shown in FIG. 12.

A faraday rotator and a half wave plate can rotate the polarization of a beam while propagating in one direction and not change its polarization when the wave is propagating in the opposite direction. An efficient flip-flop as shown in FIG. 12 can be built by using this property and sandwiching a polarizer between two such Faraday rotator/half wave plate assembly between two VCSOAs. The 45° faraday rotator and half wave plate rotate linearly polarized light by 90 degrees along one propagation direction and rotate 0 degree for the linearly polarized light propagating along the opposite direction. The S-polarizer blocks the unwanted non-inverted output from VCSOA arrays. The optical input and optical bias can be delivered via fibers, waveguides or via free space components.

In the upper VCSOA, the bias is s-polarized, and therefore the desired inverted output is s-polarized while the undesired just amplified output is p-polarized. The s polarizer can be used to remove the unwanted polarization from the input to the lower VCSOA. In a similar way, the non inverted output of the lower VCSOA is s-polarized. The Faraday rotator and half wave plate can be used to convert the output into p-polarized light which is absorbed or blocked by the polarizer. On the other hand, the desired inverted outputs from each VCSOA reaches the input of the other VCSOA closing the circuit to form a cross-coupled circuit. Dependent on the input output interconnections between various flip-flops different types of flip-flops can be formed including delay, master slave, RS and JK flip-flops.

In addition this strategy is compatible with fabrication of large arrays of flip-flops. Furthermore, because of the similarity of the circuit implementation of NAND and XOR gates, a spatial patterning of the thin films allows for the programming of general gate array to perform locally these functions.

EXAMPLE 8

Evanescently Coupled Microphotonic Logic Circuits

VCSOA's can be fabricated in large arrays and therefore large arrays of flip-flops and other logic circuits can be realized with the scheme used in FIG. 12. The interconnections between different logic gates and or flip-flops can be accomplished via conventional optical interconnection components such as waveguides, fibers, mirrors, lenses, prisms, and diffractive components. In addition evanescent coupling of optical field in one flip-flop or VCSOA logic gate can be used to transfer data from one gate to another. The physical separation of the VCSOA's must be reduced to a minimum to maximize evanescent coupling.

Figure 13A:
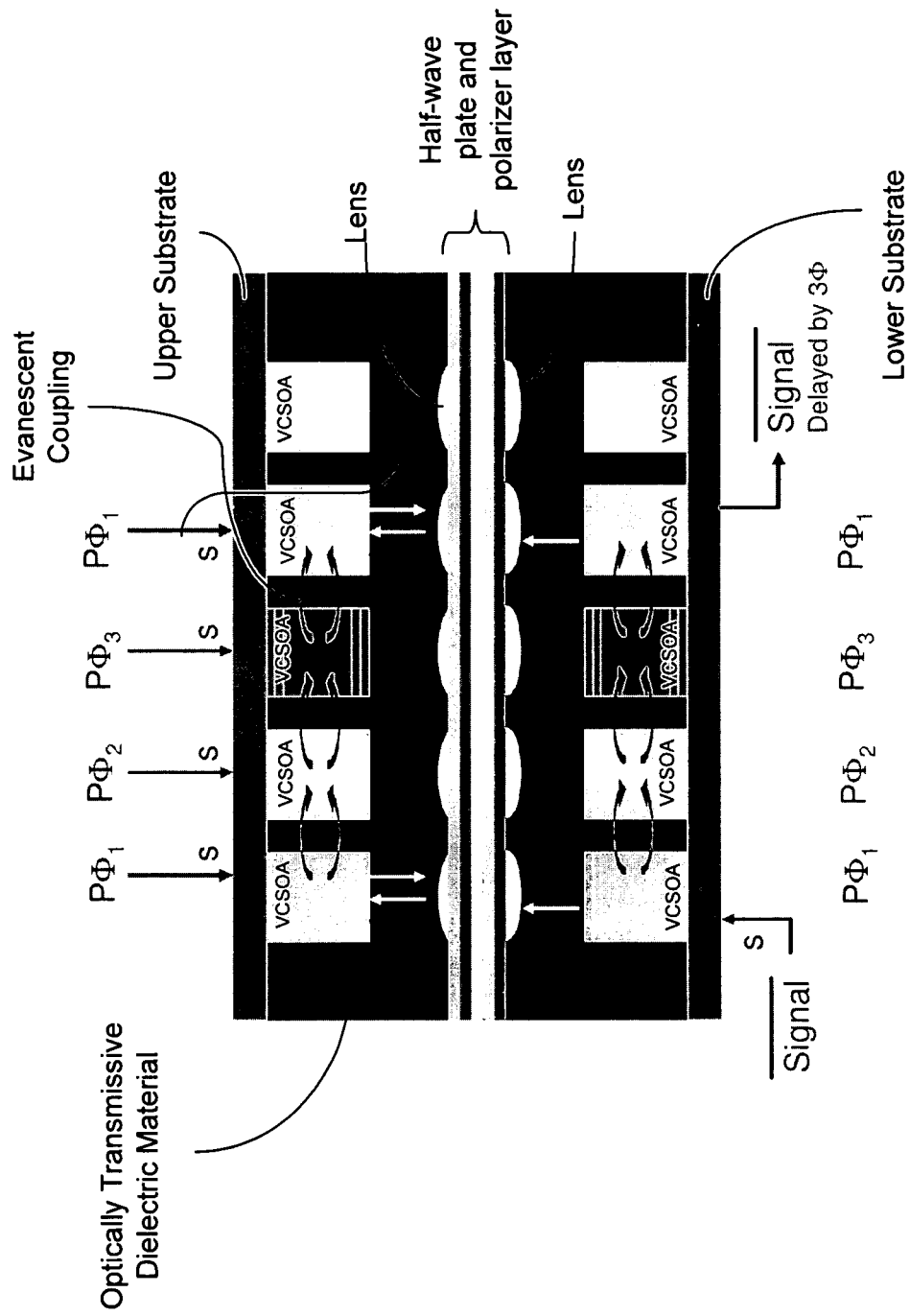
FIG. 13A shows an alternative implementation of the cross-sectional view in FIG. 9 of an array of flip flops assembled as described in FIG. 12.
Figure 13B:
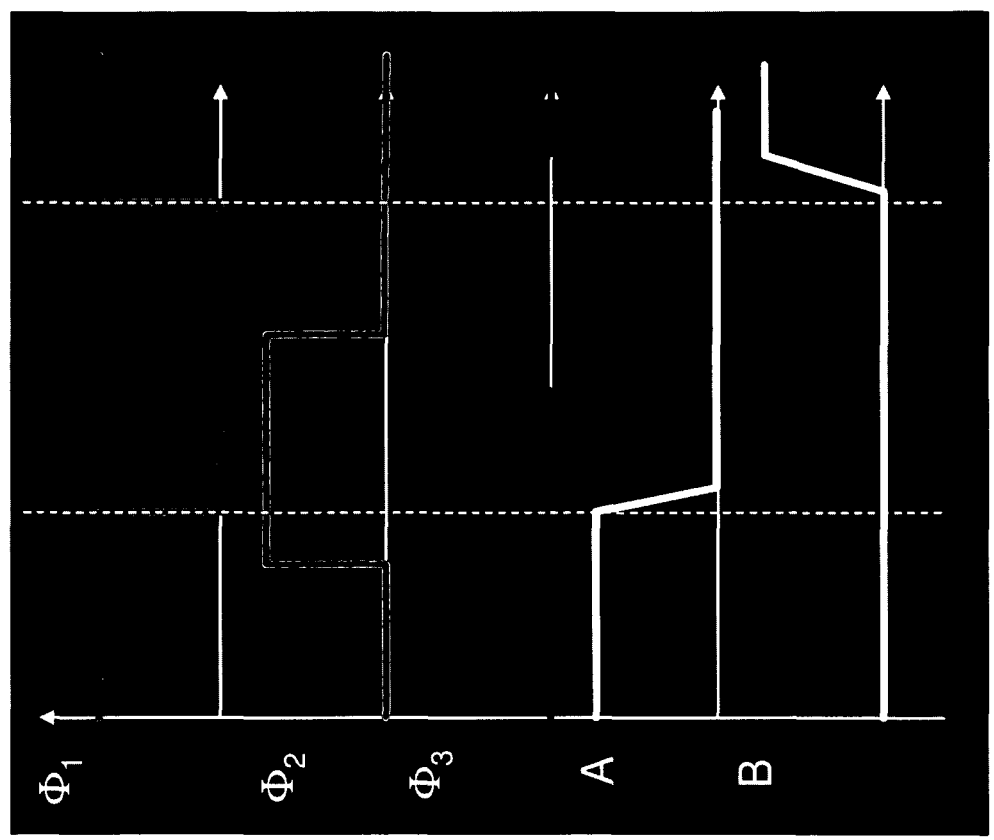
FIG. 13B shows a three phase clock scheme to move data stored between flip-flops.

FIG. 13A shows an alternative implementation of the cross-sectional view in FIG. 9 of an array of flip flops assembled as described in FIG. 12. This implementation uses evanescent optical coupling between two adjacent VCSOAs. Arrowed lines represent the evanescent coupling. FIG. 13B shows a three phase clock scheme to move data stored between flip-flops.

In FIG. 13A, in addition to the Faraday rotator—half wave plate polarizer films small lenses can be added as an option to improve optical coupling between two VCSOAs forming a flip-flop. Using evanescent coupling the state of one flip flop is copied to a slave flip-flop when clock f2 becomes active and powers up the second flip-flop in green. When the clock f3 is available the first flip flop (yellow is off) and the data is transferred from the green flip-flop to the purple one. In this fashion like in an electronic CCD data is transferred from one flip-flop to another. Evanescent field coupling can therefore be used to move data and to buffer data in an array of microphotonic flip-flops.

EXAMPLE 9

Interfacing with On-Chip Guided Interconnects

Figure 14:
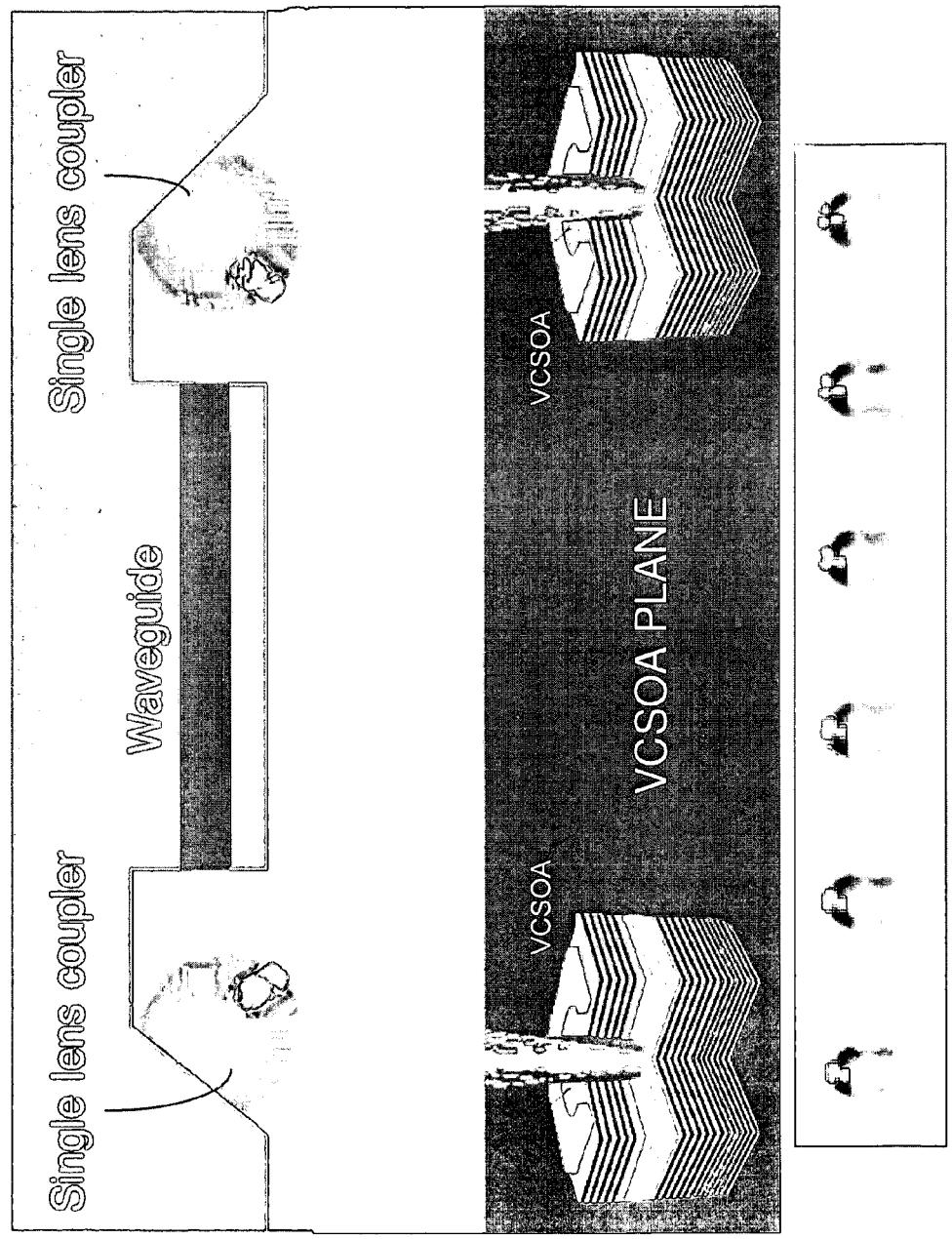
FIG. 14 illustrates one example where lens couplers such as single hemispherical lens couplers can be used for VCSOA-waveguide interface and fabricated hemispherical lens array.

Optical connections between optical VCSOA logic gates in a gate array can be implemented via waveguide-based designs. This requires in principle 3-D interconnects (mapping a 2D array to a 2D array) such as offered by free space optical interconnect schemes, or guided interconnects with sharp corner turns to bring optical signals into the plane of the gate array (form the surface normal direction). FIG. 14 illustrates one example where lens couplers such as single hemispherical lens couplers can be used for VCSOA-waveguide interface and fabricated hemispherical lens array. Hemispherical micro lenses can be fabricated on slanted surfaces of silicon V-grooves to provide sharp turn of radiation emanating from VCSOAs and its coupling into desired a waveguide. Such micro couplers can be made efficient by utilizing a hemispherical micro-lens fabrication technique.

EXAMPLE 10

4-Bit FIFO Design

Figure 15A:
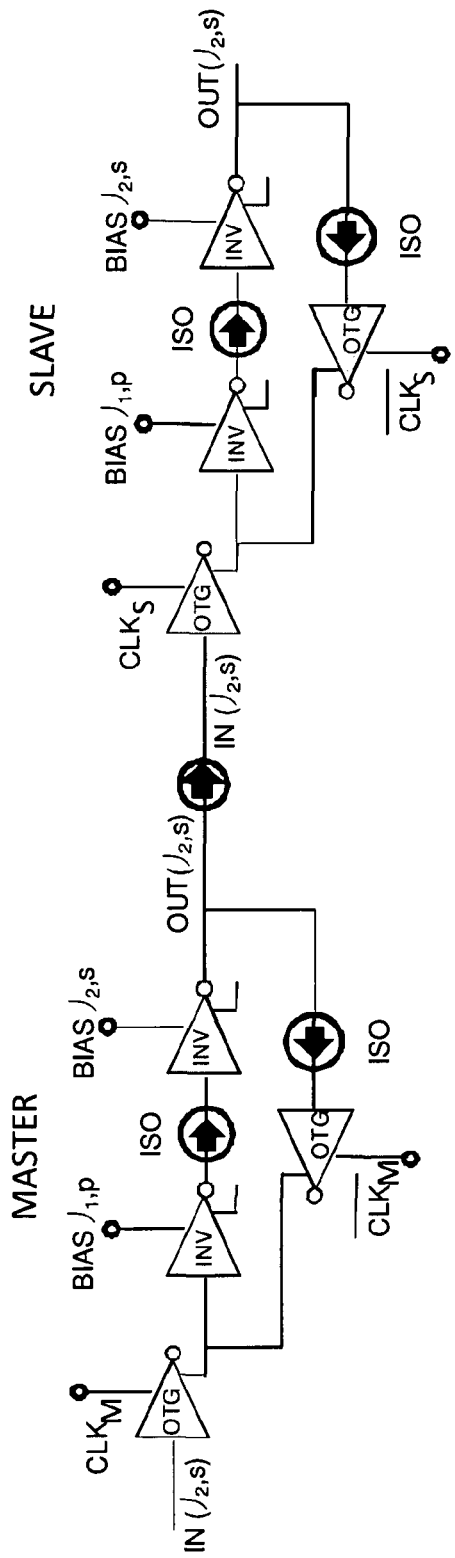
FIGS. 15A and 15B show two examples of a single memory bit stage of an all optical FIFO implemented with a MASTER/SLAVE Flip-flop.

FIG. 15A shows a single stage of a FIFO type memory based on cascaded flip-flops. This device includes a MASTER/SLAVE flip flop where two cross coupled circuits are cascaded. The control of the signal flow from the Master to the Slave is controlled by the clocks $CLK_M$ and $CLK_S$ which are two non-overlapping clock signals. These clocks control the activation of inverters to isolate or connect the cross coupled circuits. The complementary clock signals $CLK'_M$ and $CLK'_S$ are non overlapping complementary clocks to $CLK_M$ and $CLK_S$ effectively controlling the feedback loop gain. These inverters when not activated reset the cross coupled circuits to a "0" state. When they are activated the information at the input of the circuit is simply stored in the cross coupled circuit. An additional isolator at the output of each cross-coupled circuit is found to be necessary to prevent backward flow of the information. The realization of a 4 bit FIFO requires four such stages and therefore 24 VCSOA devices.

Figure 15B:
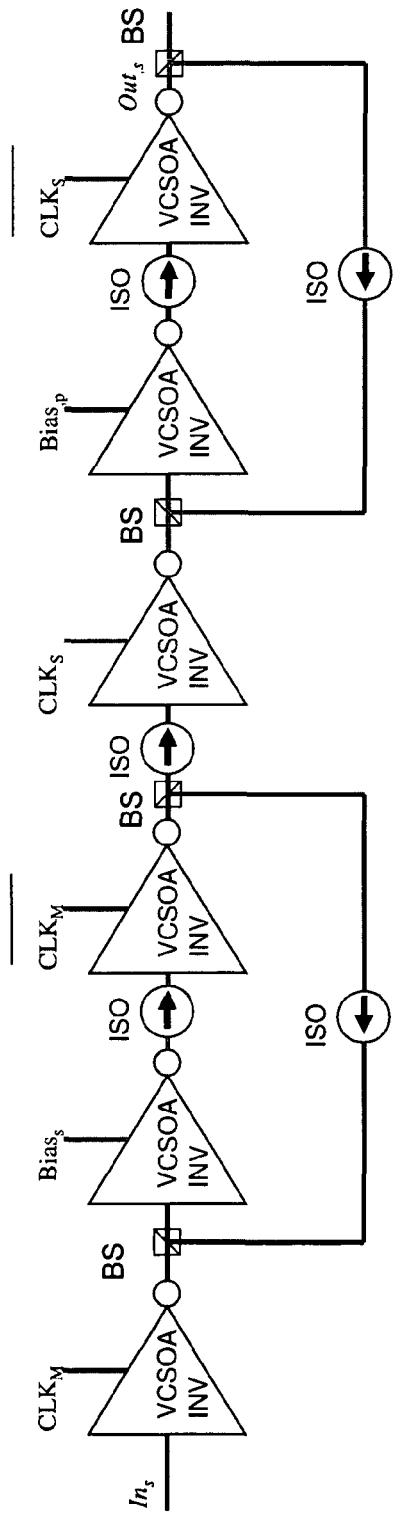

FIG. 15B shows another design for a single stage of a FIFO type memory based on cascaded flip-flops. This design has a simpler device structure than the design in FIG. 15A.

FIGS. 16A and 16B show logic diagrams of VCSOA-based XOR and NAND gates, respectively. Both XOR and NAND have two inputs (Asig and Bsig) and two optical bias (Abias and Bbias). In order to obtain the XOR logic function Asig and Abias must be modulated simultaneously, and Bsig and Bbias must be modulated simultaneously. The output is obtained by extracting only the P-polarization outputs of each inverter. A half-wave plate is necessary at the output of the second inverter in order to obtain the correct P-polarization outputs for the XOR logic function. The case for the NAND gate is identical with the exception that Bsig must be modulated while Bbias is held constant. Notably, there is similarity between these circuits and our flip-flop circuit presented earlier. The similarity of these circuit configurations can be used advantageously while implementing integrated gate arrays.

A ring oscillator can include an odd number of cascaded inverters where the output of the last inverter is fed back to the input of the first one. In electronic ring oscillators, an additional inverter is typically used as a buffer in order for the change in output loading not to affect the oscillator performance.

Figure 17:
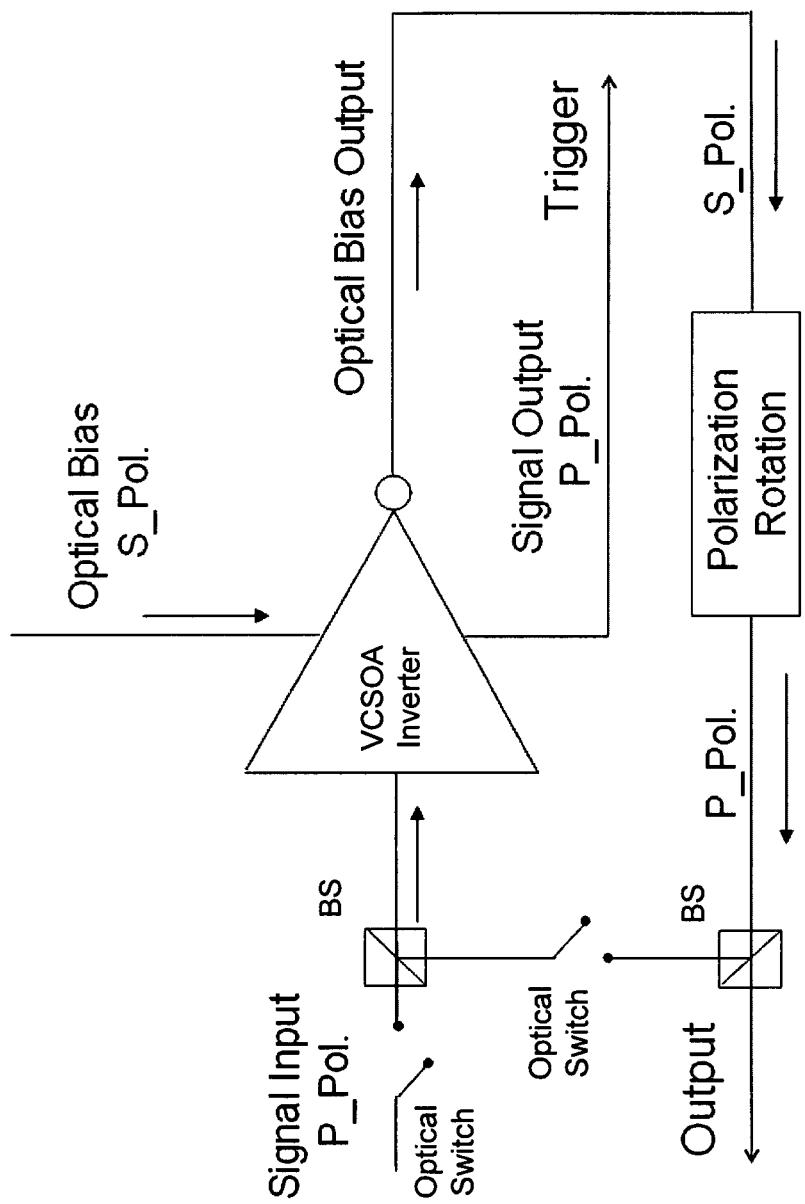
FIG. 17 shows a VCSOA based oscillator.

In the case of a VCSOA based optical inverter, the presence of the non-inverted output (in addition to the inverted one) eliminates this need and a single inverter can be used to generate stable oscillations. FIG. 17 shows a VCSOA based oscillator. The inverted output of the VCSOA inverter is fed back to its input through a polarization rotator to ensure the same polarization state is preserved at the input. The output of the oscillator is observed directly from the non inverted output without affecting the feedback path. The physical length of the feedback path determines the period of oscillation while the rise and fall time of the waveform is determined by the inherent speed of the inverter. A cascadable VCSOA inverter can be used to construct a single inverter ring oscillator. Our tests verified that the generated waveform is self-sustained by the bistable switching of the VCSOA. The repetition rate can be adjusted by changing the length of the feedback loop and the switching speed is only limited by the dynamics of VCSOA bistability and cross gain modulation, which was measured to be ranging from a few to several tens of ps for various inverters tested. The maximum measured rise time was 80 ps and the fastest was 25 ps demonstrating VCSOA device to device non-uniformities. The output of the oscillator in our test showed an extinction ratio of 5:1 at a repetition rate of 66 MHz.

While this specification contains many specifics, these should not be construed as limitations on the scope of any invention or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Thus, particular embodiments have been described. Other embodiments are within the scope of the following claims.

What is claimed is:

1. An optical device, comprising:
an optical inverter which comprises:
a vertical cavity semiconductor optical amplifier (VCSOA) that exhibits an optical gain within a gain spectral range and optical nonlinear bistability;
an input optical module to couple, a first input optical signal at a first wavelength within the gain spectral range and a second input optical signal at a second wavelength within the gain spectral range, into the VCSOA to overlap with each other to cause a cross gain modulation on the first and second input optical signals; and
an optical output module coupled to the VCSOA to select light at the first wavelength as an output optical signal, wherein:
the VCSOA is a reflective VCSOA which receives the first and second input optical signals at a first facet of the VCSOA and internally reflects light back to the first facet to output the output optical signal through the first facet;
the first and second input optical signals are in a first optical polarization and a second optical polarization that is orthogonal to the first optical polarization, respectively; and
the input optical module comprises (1) a polarization-selective beam splitter that transmits light in one of the first and second optical polarizations and reflects light in the other of the first and second optical polarizations, and (2) a polarization-insensitive beam splitter.

2. The device as in claim 1, wherein:
the polarization-selective beam splitter and the polarization-insensitive beam splitter stack on the first facet of the VCSOA to place the polarization-insensitive beam splitter between the polarization-selective beam splitter and the VCSOA, and
the polarization-selective beam splitter receives the first and second input optical signals on two different facets of the polarization-selective beam splitter to direct the first and second input optical signals through the polarization-insensitive beam splitter to enter the VCSOA, and the polarization-insensitive beam splitter reflects light output from the first facet of the VCSOA to produce a reflected beam; and
the device further comprising an optical polarizer in an optical path of the reflected beam from the polarization-insensitive beam splitter to select light in the first optical polarization as the output optical signal while rejecting light in the second optical polarization signal.

3. The device as in claim 1, wherein:
the polarization-selective beam splitter and the polarization-insensitive beam splitter stack on the first facet of the VCSOA to place the polarization-selective beam splitter between the polarization-selective beam splitter and the VCSOA, and
the polarization-selective beam splitter receives the first input optical signal to transmit through to enter the polarization-insensitive beam splitter, and the the polarization-insensitive beam splitter receives the second input optical signal to reflect a portion of the second input optical signal to overlap and co-propagate with the first input optical signal towards the VCSOA, and
the polarization selective beam splitter selects light received from the VCS OA in the first optical polarization as the output optical signal.

4. The device as in claim 1, comprising:
a substrate on which the VCSOA is formed; and
a second VCSOA formed on the substrate and positioned close to the VCSOA to be in evanescent optical coupling with the VCSOA to receive a portion of the output optical signal of the VCSOA via the evanescent optical coupling.

5. The device as in claim 1, comprising:
a substrate on which the VCSOA is formed;
a second VCSOA formed on the substrate; and
a waveguide formed between the VCSOA and the second VCSOA on the substrate to direct the output optical signal of the VCSOA into the second VCSOA.

6. The device as in claim 1, comprising:
an optical feedback loop to feed the output optical signal as input light into the VCSOA to form an optical oscillator.

7. The device as in claim 1, comprising:
at least a second optical inverter made of a second VCSOA and optically cascaded with the optical inverter.

8. The device as in claim 7, comprising:
an even number of optically cascaded additional optical inverters, one of which is optically cascaded with the optical inverter and each additional optical inverter comprising an VCSOA, and
an optical feedback loop connecting two ends of the cascaded additional optical inverters and the optical inverter to form an optical oscillator.

9. The device as in claim 1, comprising:
at least a second optical inverter made of a second VCSOA that is optically coupled to the optical inverter to form an optical flip-flop.

10. The device as in claim 1, comprising:
at least a second optical inverter made of a second VCSOA that optically coupled to the optical inverter to form an optical NOR gate.

11. The device as in claim 1, comprising:
at least a second optical inverter made of a second VCSOA that is optically coupled to the optical inverter to form an optical XOR gate.

12. The device as in claim 1, comprising:
at least a second optical inverter made of a second VCSOA that is optically coupled to the optical inverter to form an optical NAND gate.

13. An optical device, comprising:
an optical inverter which comprises:
a vertical cavity semiconductor optical amplifier (VCSOA) that exhibits an optical gain within a gain spectral range and optical nonlinear bistability;
an input optical module to couple, a first input optical signal in a first optical polarization and at a first wavelength within the gain spectral range and a second input optical signal in a second optical polarization orthogonal to the first optical polarization and at a second wavelength within the gain spectral range, into the VCSOA to overlap with each other to cause a cross gain modulation on the first and second input optical signals;
an optical output module coupled to the VCSOA to select light output by the VCSOA in the second optical polarization as an output optical signal
wherein:
the input optical module comprises (1) a polarization-selective beam splitter that transmits light in one of the first and second optical polarizations and reflects light in the other of the first and second optical polarizations, and (2) a polarization-insensitive beam splitter.

14. The device as in claim 13, wherein:
the VCSOA exhibits optical bistablility in the optical gain to produce a low optical gain when input light is below a threshold optical power and a high optical gain is above the threshold optical power, and
the device comprises a mechanism to control the first input optical signal as a modulated optical signal which has a first optical power level below the threshold optical power and a second optical power level above the threshold optical power.

15. The device as in claim 14, wherein:
the device comprises a mechanism to control the second input optical signal as a CW signal.

* * * * *